US012660563B2

(12) United States Patent
Ishikawa et al.

(10) Patent No.: US 12,660,563 B2
(45) Date of Patent: Jun. 16, 2026

(54) SUBSTRATE SUPPORT AND PLASMA PROCESSING APPARATUS

(71) Applicant: TOKYO ELECTRON LIMITED, Tokyo (JP)

(72) Inventors: Shinya Ishikawa, Miyagi (JP); Daiki Hariu, Miyagi (JP); Takahiko Sato, Miyagi (JP); Tsutomu Nagai, Miyagi (JP); Takafumi Tsuda, Miyagi (JP); Keigo Toyoda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 192 days.

(21) Appl. No.: 18/104,266

(22) Filed: Jan. 31, 2023

(65) Prior Publication Data

US 2023/0268216 A1 Aug. 24, 2023

(30) Foreign Application Priority Data

Feb. 1, 2022 (JP) ................................. 2022-013858
Jan. 24, 2023 (JP) ................................. 2023-008538

(51) Int. Cl.
| | |
|---|---|
| *H01L 21/683* | (2006.01) |
| *H01J 37/32* | (2006.01) |
| *H01T 23/00* | (2006.01) |
| *H10P 72/00* | (2026.01) |
| *H10P 72/72* | (2026.01) |

(52) U.S. Cl.
CPC ...... *H10P 72/722* (2026.01); *H01J 37/32724* (2013.01); *H10P 72/0421* (2026.01); *H01J 2237/3341* (2013.01)

(58) Field of Classification Search
CPC ............ H01L 21/6833; H01L 21/67069; H01J 37/32724
USPC .......................................................... 361/234
See application file for complete search history.

(56) References Cited

U.S. PATENT DOCUMENTS

| | | | |
|---|---|---|---|
| 2017/0032935 A1 | 2/2017 | Benjamin et al. | |
| 2017/0110356 A1* | 4/2017 | Matyushkin ...... | H01J 37/32577 |
| 2019/0237300 A1 | 8/2019 | Ikeda et al. | |
| 2019/0295823 A1 | 9/2019 | Kofuji et al. | |
| 2020/0219755 A1* | 7/2020 | Akatsuka ............ | H01L 21/6831 |

(Continued)

FOREIGN PATENT DOCUMENTS

| | | |
|---|---|---|
| JP | 2002231798 A | 8/2002 |
| JP | 2011119654 A | 6/2011 |

(Continued)

*Primary Examiner* — Crystal L Hammond
*Assistant Examiner* — Lucy M Thomas
(74) *Attorney, Agent, or Firm* — Nath, Goldberg & Meyer; Jerald L. Meyer; Tanya E. Harkins

(57) ABSTRACT

A substrate support is arranged in a processing container. The substrate support includes an electrostatic chuck provided with a first support surface for supporting a substrate, provided with a first electrode and a second electrode which are arranged in the electrostatic chuck sequentially from the first support surface, and made of a dielectric material, and a base configured to support the electrostatic chuck. The second electrode is arranged at a position having a distance to the first support surface that is equal to or less than a distance to the base. A voltage for attracting the substrate is applied to the first electrode and bias power is supplied to the second electrode.

17 Claims, 18 Drawing Sheets

(56) References Cited

U.S. PATENT DOCUMENTS

| 2021/0074524 | A1* | 3/2021 | Koshimizu ....... H01J 37/32642 |
| 2021/0074571 | A1* | 3/2021 | Momiyama ....... H01L 21/68735 |
| 2021/0098239 | A1* | 4/2021 | Tamura ............ H01J 37/32715 |
| 2022/0375731 | A1* | 11/2022 | Koshimizu ....... H01J 37/32642 |
| 2023/0057107 | A1* | 2/2023 | Takebayashi ..... H01J 37/32642 |
| 2023/0064941 | A1* | 3/2023 | Lee ........................ B25J 9/1697 |

FOREIGN PATENT DOCUMENTS

| JP | 2021044540 A | 3/2021 |
| JP | 2021515392 A | 6/2021 |
| WO | 2018179891 A1 | 10/2018 |

* cited by examiner

| | | | | | | | |
|---|---|---|---|---|---|---|---|
| | Source power(27MHz)[W] | 800 | 800 | 2500 | 2500 | 800 | 2500 |
| | Bias power(400kHz)[W] | 50 | 200 | 50 | 200 | – | – |
| | Bias power(13MHz)[W] | – | – | – | – | 900 | 900 |
| Example | Base voltage [V] | 247 | 631 | 262 | 434 | 987 | 220 |
| | Heater electrode voltage [V] | 234 | 610 | 239 | 407 | 30 | 14 |
| | Etching rate [nm/min] | 392 | 645 | 920 | 1235 | 1214 | 2012 |
| Reference example | Base voltage [V] | 618 | 1153 | 1105 | 1735 | 1153 | 392 |
| | Heater electrode voltage [V] | 364 | 784 | 514 | 861 | 31 | 15 |
| | Etching rate [nm/min] | 325 | 599 | 784 | 1104 | 1169 | 1998 |
| Example/ Reference example | Base voltage [%] | 40 | 55 | 24 | 25 | 86 | 56 |
| | Heater electrode voltage [%] | 64 | 78 | 47 | 47 | 99 | 95 |
| | Etching rate [%] | 121 | 108 | 117 | 112 | 104 | 101 |

FIG. 21

SUBSTRATE SUPPORT AND PLASMA PROCESSING APPARATUS

CROSS-REFERENCE TO RELATED APPLICATIONS

This application is based upon and claims the benefit of priority from Japanese Patent Application Nos. 2022-013858 and 2023-008538, filed on Feb. 1, 2022 and Jan. 24, 2023, respectively, the entire contents of which are incorporated herein by reference.

TECHNICAL FIELD

The present disclosure relates to a substrate support and a plasma processing apparatus.

BACKGROUND

Conventionally, an electrostatic chuck that performs electrostatic attraction is used to hold a substrate in a plasma processing apparatus. An electrode for electrostatic chucking is provided in the electrostatic chuck, and the substrate on the electrostatic chuck is attracted by applying a voltage to the electrode from a DC power supply. Further, in the plasma processing apparatus, in order to supply bias power, for example, a radio-frequency power supply is connected to a base supporting a dielectric film of the electrostatic chuck (Patent Document 1). Further, in order to supply bias power, for example, an inner peripheral electrode and an outer peripheral electrode are provided inside the dielectric film, and a radio-frequency power supply is connected to the inner peripheral electrode and the outer peripheral electrode (Patent Document 2).

PRIOR ART DOCUMENTS

Patent Documents

Patent Document 1: US Application Publication No. 2019/0295823
Patent Document 2: US Application Publication No. 2019/0237300

SUMMARY

According to one embodiment of the present disclosure, there is provided a substrate support arranged in a processing container, including: an electrostatic chuck provided with a first support surface for supporting a substrate, provided with a first electrode and a second electrode which are arranged in the electrostatic chuck sequentially from the first support surface, and made of a dielectric material; and a base configured to support the electrostatic chuck, wherein the second electrode is arranged at a position having a distance to the first support surface that is equal to or less than a distance to the base, a voltage for attracting the substrate is applied to the first electrode, and bias power is supplied to the second electrode.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 5 is a diagram showing an example of experimental results of an etching process.

FIG. 21 is a diagram showing an example of the experimental results according to the second embodiment.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Embodiments of a substrate support and a plasma processing apparatus disclosed herein will now be described in detail with reference to the drawings. Note that the disclosed technique is not limited by the following embodiments.

When a radio-frequency power supply is connected to a base to supply bias power, it is conceivable to increase the voltage (Vpp) on a substrate in order to improve an etching rate. However, in a circuit extending from the radio-frequency power supply to an upper electrode through plasma, the series voltage component due to the capacitance between the base and a heater electrode in an electrostatic chuck does not contribute to the improvement of Vpp on the substrate and may consume electric power unnecessarily. Furthermore, in this circuit, the voltage of the bias power supplied to the base becomes high, and the withstand voltage required for each member of the circuit also becomes high. In particular, when the frequency of the bias power is low, the influence thereof becomes large. Therefore, it is expected to lower the voltage of the bias power supplied to the base and improve the efficiency of the bias power on the low frequency side.

First Embodiment

[Configuration of Plasma Processing System]

Figure 1:
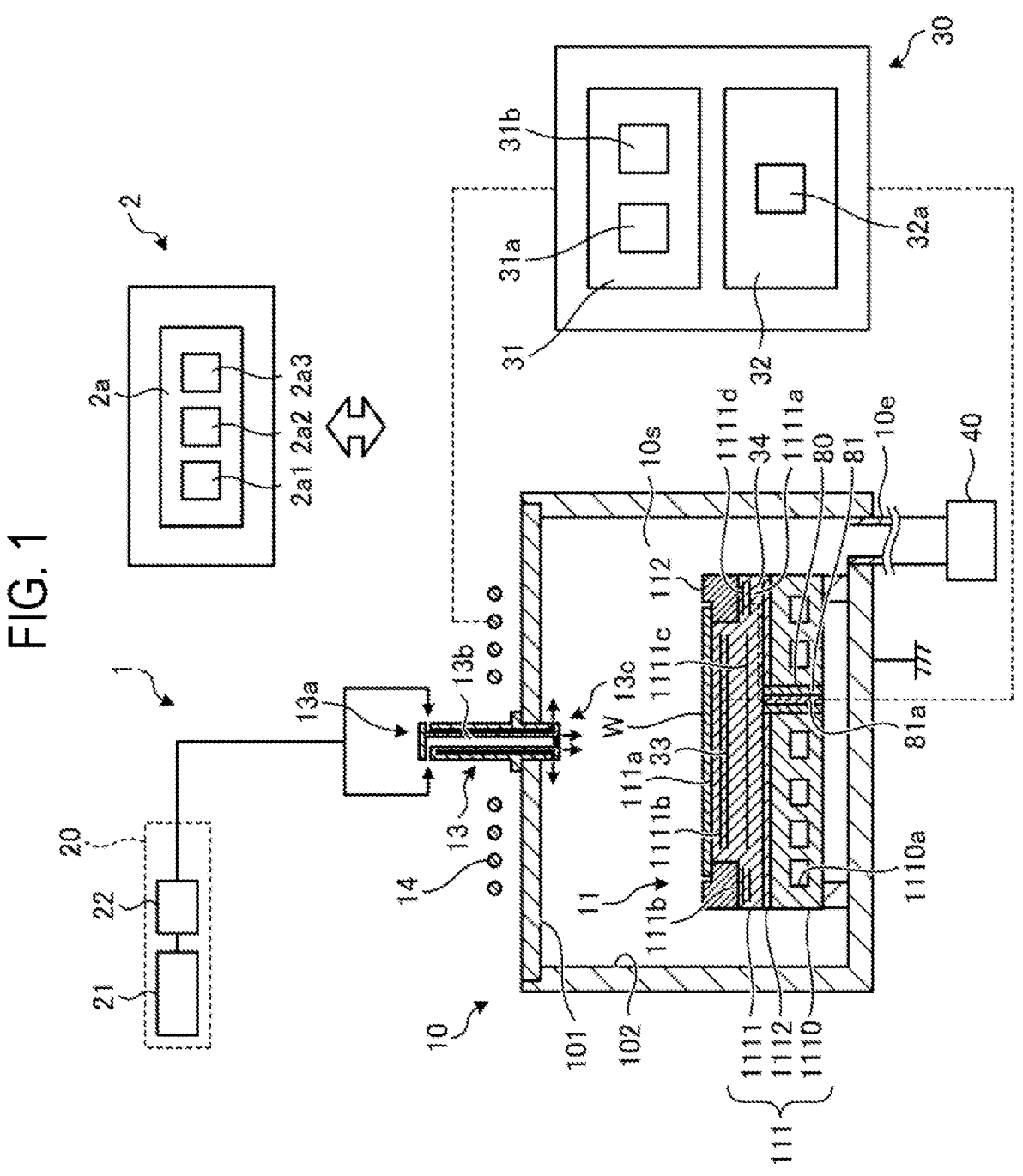
FIG. 1 is a diagram showing an example of a plasma processing apparatus according to a first embodiment of the present disclosure.

A configuration example of a plasma processing system will be described below. FIG. 1 is a diagram showing an example of a plasma processing apparatus according to a first embodiment of the present disclosure. As shown in FIG. 1, the plasma processing system includes an inductively coupled plasma processing apparatus 1 and a controller 2. That is, the inductively coupled plasma processing apparatus 1 is an ICP (Inductively Coupled Plasma) type plasma processing apparatus. The inductively coupled plasma processing apparatus 1 includes a plasma processing chamber 10, a gas supply part 20, a power supply 30, and an exhaust system 40. The plasma processing chamber 10 is an example of a processing container and includes a dielectric window. The plasma processing apparatus 1 also includes a substrate support 11, a gas introduction part, and an antenna 14. The substrate support 11 is arranged within the plasma processing chamber 10. The antenna 14 is arranged on or above the plasma processing chamber 10 (i.e., on or above the dielectric window 101). The plasma processing chamber 10 has a plasma processing space 10s defined by the dielectric window 101, the sidewalls 102 of the plasma processing chamber 10, and the substrate support 11. The plasma processing chamber 10 has at least one gas supply port for supplying at least one processing gas to the plasma processing space 10s and at least one gas exhaust port for exhausting the gas from the plasma processing space. The plasma processing chamber 10 is grounded.

The substrate support 11 includes a body portion 111 and a ring assembly 112. The body portion 111 has a central region 111a for supporting a substrate W and an annular region 111b for supporting the ring assembly 112. A wafer is an example of the substrate W. The annular region 111b of the body portion 111 surrounds the central region 111a of the body portion 111 in a plan view. The substrate W is arranged on the central region 111a of the body portion 111, and the ring assembly 112 is arranged on the annular region 111b of the body portion 111 so as to surround the substrate W on the central region 111a of the body portion 111. Accordingly, the central region 111a is also referred to as a substrate support surface for supporting the substrate W, and the annular region 111b is also referred to as a ring support surface for supporting the ring assembly 112. In addition, the central region 111a is an example of a first support surface, and the annular region 111b is an example of a second support surface.

In one embodiment, the body portion 111 includes a base 1110, an electrostatic chuck 1111 and an adhesive layer 1112. The base 1110 includes a conductive member. The electrostatic chuck 1111 is arranged on the base 1110 with the adhesive layer 1112 interposed therebetween. The electrostatic chuck 1111 includes a ceramic member 1111a, and electrostatic electrodes 1111b and 1111d, a heater electrode 1111c and bias electrodes 33 and 34 disposed within the ceramic member 1111a. The ceramic member 1111a has a central region 111a. In one embodiment, the ceramic member 1111a also has an annular region 111b. Another member surrounding the electrostatic chuck 1111, such as an annular electrostatic chuck or an annular insulating member, may have the annular region 111b. In this case, the ring assembly 112 may be arranged on the annular electrostatic chuck or the annular insulating member, or may be arranged on both the electrostatic chuck 1111 and the annular insulating member.

The electrostatic electrode 1111b is an electrode for attracting the substrate W placed on the central region 111a. The electrostatic electrode 1111d is an electrode for attracting the ring assembly 112 placed on the annular region 111b. A voltage for attracting the substrate W or the ring assembly 112 is applied to the electrostatic electrodes 1111b and 1111d from a DC power supply (not shown). The heater electrode 1111c is an example of a heater that forms a part of a temperature control module, which will be described later. The bias electrodes 33 and 34 are examples of at least one RF/DC electrode coupled to an RF (Radio Frequency) power supply 31 and/or a DC (Direct Current) power supply 32, which will be described later. The conductive member of the base 1110 and at least one RF/DC electrode may function as a plurality of bias electrodes. The electrostatic electrode 1111b may function as a bias electrode. Accordingly, the substrate support 11 includes at least one bias electrode.

In the central region 111a of the ceramic member 1111a, the electrostatic electrode 1111b, the bias electrode 33, and the heater electrode 1111c are provided sequentially from the central region 111a side. That is, the bias electrode 33 is arranged between the electrostatic electrode 1111b and the heater electrode 1111c. Further, the electrostatic electrode 1111d and the bias electrode 34 are provided in the annular region 111b sequentially from the annular region 111b side. The electrostatic electrode 1111d may be two or more electrodes when the ring assembly 112 is attracted with an electrode-pair. Further, the electrostatic electrode 1111d may not be provided when the ring assembly 112 is not attracted. In this regard, the bias electrode 33 is arranged at a position where the distance to the upper surface of the central region 111a is equal to or less than the distance to the upper surface of the base 1110. More preferably, the bias electrode 33 is arranged at a position where the distance to the upper surface of the central region 111a is less than the distance to the upper surface of the base 1110. Similarly, the bias electrode 34 is arranged at a position where the distance to the upper surface of the annular region 111b is equal to or less than the distance to the upper surface of the base 1110. More preferably, the bias electrode 34 is arranged at a position where the distance to the upper surface of the annular region 111b is less than the distance to the upper surface of the base 1110.

The bias electrodes 33 and 34 are connected to a second RF generator 31*b*, which will be described below, via an electrical path composed of a conductor in the ceramic member 1111*a* and a conductor 81*a* in the insulating sleeve 81 provided in the through-hole 80 of the base 1110. The electrostatic electrode 1111*b* is an example of a first electrode, and the bias electrode 33 is an example of a second electrode. Further, the electrostatic electrode 1111*d* is an example of a third electrode, and the bias electrode 34 is an example of a fourth electrode. That is, the third electrode is at least one electrode, and may be two or more electrodes in the case of chucking with an electrode-pair. In addition, the electrostatic electrode 1111*d* may be integrated with the electrostatic electrode 1111*b*, and the bias electrode 34 may be integrated with the bias electrode 33.

The ring assembly 112 includes one or more annular members. In one embodiment, the one or more annular members include one or more edge rings and at least one cover ring. The edge ring is made of a conductive material or an insulating material, and the cover ring is made of an insulating material.

Further, the substrate support 11 may include a temperature control module configured to control the temperature of at least one selected from a group of the electrostatic chuck 1111, the ring assembly 112, and the substrate W to a target temperature. The temperature control module may include a heater electrode 1111*c*, a heat transfer medium, a flow path 1110*a*, or a combination thereof. A heat transfer fluid, such as brine or gas, flows through the flow path 1110*a*. In one embodiment, the flow path 1110*a* is formed in the base 1110, and one or more heaters are arranged in the ceramic member 1111*a* of the electrostatic chuck 1111. In addition, the substrate support 11 may also include a heat transfer gas supply part configured to supply a heat transfer gas to the gap between the back surface of the substrate W and the central region 111*a*.

The gas introduction part is configured to introduce at least one processing gas from the gas supply part 20 into the plasma processing space 10*s*. In one embodiment, the gas introduction part includes a center gas injector (CGI) 13. The center gas injector 13 is arranged above the substrate support 11 and attached to a central opening formed in the dielectric window 101. The center gas injector 13 has at least one gas supply port 13*a*, at least one gas flow path 13*b*, and at least one gas introduction port 13*c*. The processing gas supplied to the gas supply port 13*a* passes through the gas flow path 13*b* and is introduced into the plasma processing space 10*s* from the gas introduction port 13*c*. In addition to or instead of the center gas injector 13, the gas introduction part may include one or more side gas injectors (SGIs) attached to one or more openings formed in the sidewall 102.

The gas supply part 20 may include at least one gas source 21 and at least one flow rate controller 22. In one embodiment, the gas supply part 20 is configured to supply at least one processing gas from the corresponding gas source 21 to the gas introduction part via the corresponding flow rate controller 22. Each flow rate controller 22 may include, for example, a mass flow controller or a pressure-controlled flow controller. Additionally, the gas supply part 20 may include one or more flow rate modulation devices that modulate or pulse the flow rate of at least one processing gas.

The power supply 30 includes an RF power supply 31 coupled to the plasma processing chamber 10 through at least one impedance matching circuit. The RF power supply 31 is configured to supply at least one RF signal (RF power)

to at least one bias electrode 33 or 34 and the antenna 14. Thus, plasma is formed from at least one processing gas supplied to the plasma processing space 10*s*. Accordingly, the RF power supply 31 may function as at least a part of the plasma generator configured to generate plasma from one or more processing gases in the plasma processing chamber 10. Further, by supplying a bias RF signal to at least one bias electrode 33 or 34, it is possible to generate a bias potential in the substrate W and draw ions in the formed plasma into the substrate W.

In one embodiment, the RF power supply 31 includes a first RF generator 31*a* and a second RF generator 31*b*. The first RF generator 31*a* is coupled to the antenna 14 and configured to generate a source RF signal (source RF power) for plasma generation via at least one impedance matching circuit. In one embodiment, the source RF signal has a frequency within the range of 10 MHz to 150 MHz. In one embodiment, the first RF generator 31*a* may be configured to generate multiple source RF signals having different frequencies. The one or more source RF signals thus generated are supplied to the antenna 14.

The second RF generator 31*b* is coupled to at least one bias electrode 33 or 34 via at least one impedance matching circuit and configured to generate a bias RF signal (bias RF power). The frequency of the bias RF signal may be the same as or different from the frequency of the source RF signal. In one embodiment, the bias RF signal has a frequency lower than that of the source RF signal. In one embodiment, the bias RF signal has a frequency within the range of 100 kHz to 60 MHz. In one embodiment, the second RF generator 31*b* may be configured to generate multiple bias RF signals having different frequencies. The one or more bias RF signals thus generated are supplied to at least one bias electrode 33 or 34. In various embodiments, at least one of the source RF signal and the bias RF signal may be pulsed.

The power supply 30 may also include a DC power supply 32 coupled to the plasma processing chamber 10. The DC power supply 32 includes a bias DC generator 32*a*. In one embodiment, the bias DC generator 32*a* is connected to at least one bias electrode 33 or 34 and configured to generate a bias DC signal. The bias DC signal thus generated is applied to at least one bias electrode 33 or 34.

In various embodiments, the bias DC signal may be pulsed. In this case, a sequence of voltage pulses is applied to at least one bias electrode 33 or 34. The voltage pulses may have a pulse waveform having a rectangular shape, a trapezoidal shape, a triangular shape, a sawtooth shape, or a combination thereof. That is, the bias DC signal may be a pulse wave such as a rectangular wave, a trapezoidal wave, a triangle wave, a sawtooth wave, or a combination thereof. In one embodiment, a waveform generator for generating a sequence of voltage pulses from the DC signal is connected between the bias DC generator 32*a* and the at least one bias electrode 33 or 34. Therefore, the bias DC generator 32*a* and the waveform generator constitute a voltage pulse generator. The voltage pulse may have a positive polarity or a negative polarity. Further, the sequence of voltage pulses may include one or more positive voltage pulses and one or more negative voltage pulses in one cycle. The bias DC generator 32*a* may be provided in addition to the RF power supply 31, or may be provided instead of the second RF generator 31*b*.

The antenna 14 includes one or more coils. In one embodiment, the antenna 14 may include an outer coil and an inner coil that are coaxially arranged. In this case, the RF power supply 31 may be connected to both the outer coil and the inner coil, or may be connected to either one of the outer coil and the inner coil. In the former case, the same RF generator may be connected to both the outer coil and the inner coil, or individual RF generators may be separately connected to the outer coil and the inner coil.

The exhaust system 40 may be connected to, for example, a gas discharge port 10$e$ provided at the bottom of the plasma processing chamber 10. The exhaust system 40 may include a pressure regulation valve and a vacuum pump. The pressure regulation valve regulates the pressure in the plasma processing space 10$s$. The vacuum pump may include a turbomolecular pump, a dry pump, or a combination thereof.

The controller 2 processes computer-executable instructions that cause the plasma processing apparatus 1 to perform various processes described in the present disclosure. The controller 2 may be configured to control elements of the plasma processing apparatus 1 to perform various processes described herein. In one embodiment, a part or all of the controller 2 may be included in the plasma processing apparatus 1. The controller 2 may include a processing part 2$a$1, a storage part 2$a$2, and a communication interface 2$a$3. The controller 2 is realized by, for example, a computer 2$a$. The processing part 2$a$1 may be configured to perform various control operations by reading a program from the storage part 2$a$2 and executing the program thus read. This program may be stored in the storage part 2$a$2 in advance, or may be acquired via a medium when necessary. The acquired program is stored in the storage part 2$a$2, and is read from the storage part 2$a$2 and executed by the processing part 2$a$1. The medium may be various storage media readable by the computer 2$a$, or may be a communication line connected to the communication interface 2$a$3. The processing part 2$a$1 may be a CPU (Central Processing Unit). The storage part 2$a$2 may include a RAM (Random Access Memory), a ROM (Read Only Memory), a HDD (Hard Disk Drive), an SSD (Solid State Drive), or a combination thereof. The communication interface 2$a$3 may communicate with the plasma processing apparatus 1 via a communication line such as a LAN (Local Area Network) or the like.

[Equivalent Circuit Near Electrostatic Chuck]

Figure 2:
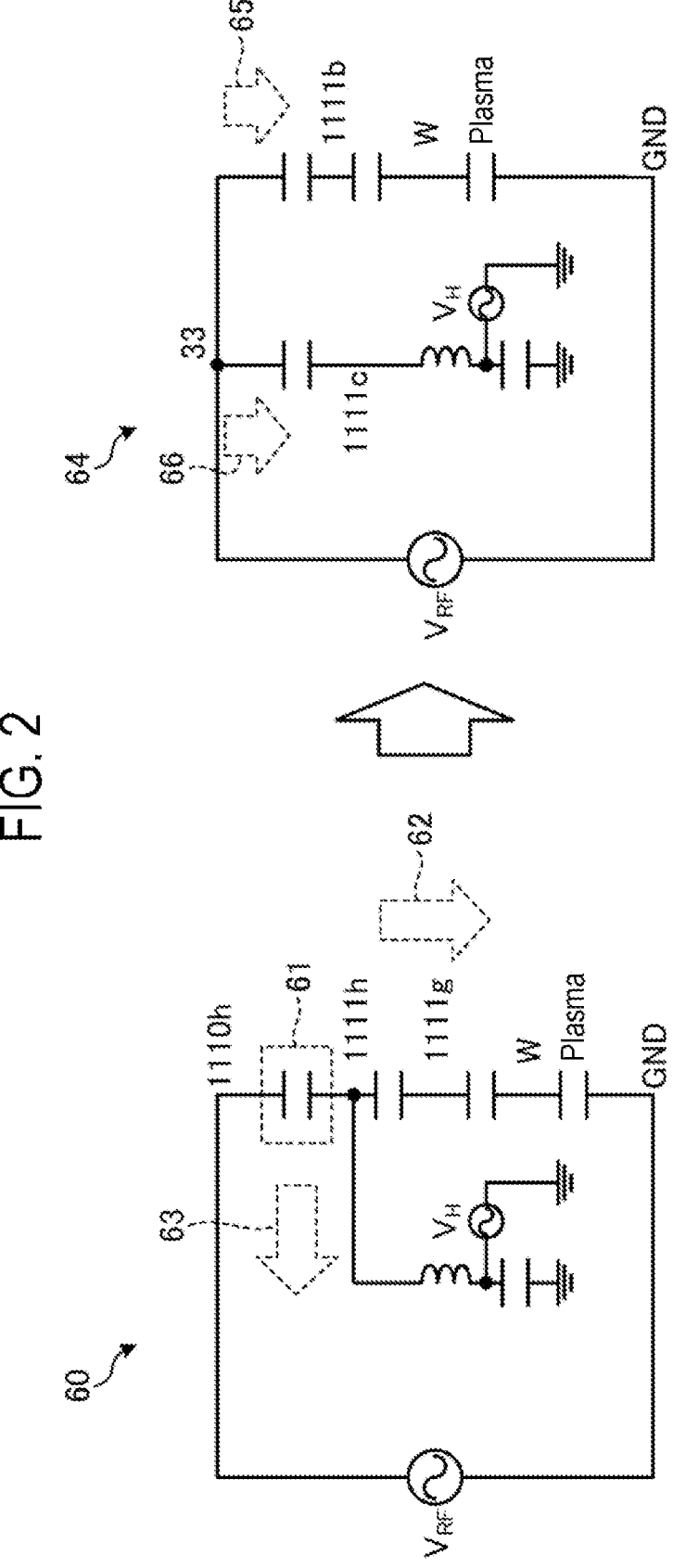
FIG. 2 is a diagram showing an example of an equivalent circuit of an electrostatic chuck and plasma in the present embodiment and a reference example.

Next, an equivalent circuit of a circuit through which a bias RF signal flows will be described with reference to FIG. 2. FIG. 2 is a diagram showing examples of equivalent circuits of an electrostatic chuck and plasma in the present embodiment and a reference example. In FIG. 2, the bias RF signal supplied to the bias electrode is denoted by $V_{RF}$, and the AC (Alternating Current) power supply of the heater power supplied to the heater electrode 1111$c$ is denoted by $V_H$. The bias electrode 33 will be described as an example of the bias electrode with reference to FIG. 2.

An equivalent circuit 60 shown in FIG. 2 represents a case where a bias RF signal is supplied to the base 1110$h$ in a conventional substrate support which is a reference example. In the equivalent circuit 60, the bias RF signal flows through a capacitance 61 between base 1110$h$ and the heater electrode 1111$h$, and then flows divisionally to a path 62 through which the bias RF signal flows toward the ground (GND) through the electrostatic electrode 1111$g$, the substrate W and the plasma and a path 63 through which the bias RF signal branches to the heater power supply side and flows toward the ground (GND). In other words, the equivalent circuit 60 requires an unnecessary Vpp of the voltage component in the capacitance 61. That is, in the equivalent circuit 60, the more current flows through the plasma, the more current flows through the path 63. As a result, an electric potential difference is generated between the base 1110$h$ and the heater electrode 1111$h$ as much as the impedance of the capacitance 61.

An equivalent circuit 64 shown in FIG. 2 represents a case where a bias RF signal is supplied to the bias electrode 33 in the substrate support 11 of the present embodiment. In the equivalent circuit 64, the bias RF signal flows divisionally to a path 65 through which the bias RF signal flows toward the ground (GND) through the bias electrode 33, the electrostatic electrode 1111$b$, the substrate W and the plasma and a path 66 through which the bias RF signal branches from the bias electrode 33 and flows toward the heater power supply side ground (GND) through the heater electrode 1111$c$. In the substrate support 11, the bias electrode 33 is brought closer to the electrostatic electrode 1111$b$ to reduce the impedance between the bias electrode 33 and the electrostatic electrode 1111$b$. Since the path 66 on the heater electrode 1111$c$ side forms a parallel circuit with the path 65 on the plasma side, the electric potentials of the heater electrode 1111$c$ and the bias electrode 33 can be made substantially equal to each other so that no electric potential difference occurs. In other words, it works favorably for the withstand voltage design. As a case of the bias electrode 34, even if the heater electrode 1111$c$ is not located thereunder, the impedance between the bias electrode 34 and the electrostatic electrode 1111$d$ can be reduced.

[Experimental Result]

First, the electric potential of each part when 10 Vpp is applied to the bases 1110 and 1110$h$ or the bias electrode 33 in the conventional substrate support as a reference example and the substrate support 11 of the present embodiment will be described. In the bases 1110 and 1110$h$, the voltage was 10.2 V in the reference example and 9.4 V in the present embodiment. In the heater electrodes 1111$c$ and 1111$h$, the voltage was 6.4 V in the reference example and 8.6 V in the present embodiment. In the substrate W, the voltage was 2.9V in the reference example and 7.2V in the present embodiment. In the edge ring of the ring assembly 112, the voltage was 2.4V in the reference example and 4.6V in the present embodiment. It can be seen that the electric potential difference between the base 1110 and the heater electrode 1111$c$ is smaller in the present embodiment than in the reference example.

Next, a simulation was performed in which these results were applied to the case where a bias RF signal is supplied so that the substrate W has an electric potential of 10 kVpp (400 kHz). In this case, in the reference example, it is necessary to supply the bias RF signal so that the base 1110$h$ has an electric potential of 35 kV. On the other hand, in the present embodiment, it is necessary to supply the bias RF signal so that the bias electrode 33 has an electric potential of 13 kV. That is, it is possible to set the electric potential of the substrate W to the same electric potential as in the conventional case using the bias RF signal that has an electric potential smaller than that of the reference example (about 40% of the electric potential in the reference example). In addition, regarding the electric potentials of the heater electrodes 1111$c$ and 1111$h$, it was 22 kV in the reference example but 12 kV in the present embodiment, which is about 54% of the electric potential in the reference example.

Figure 3:
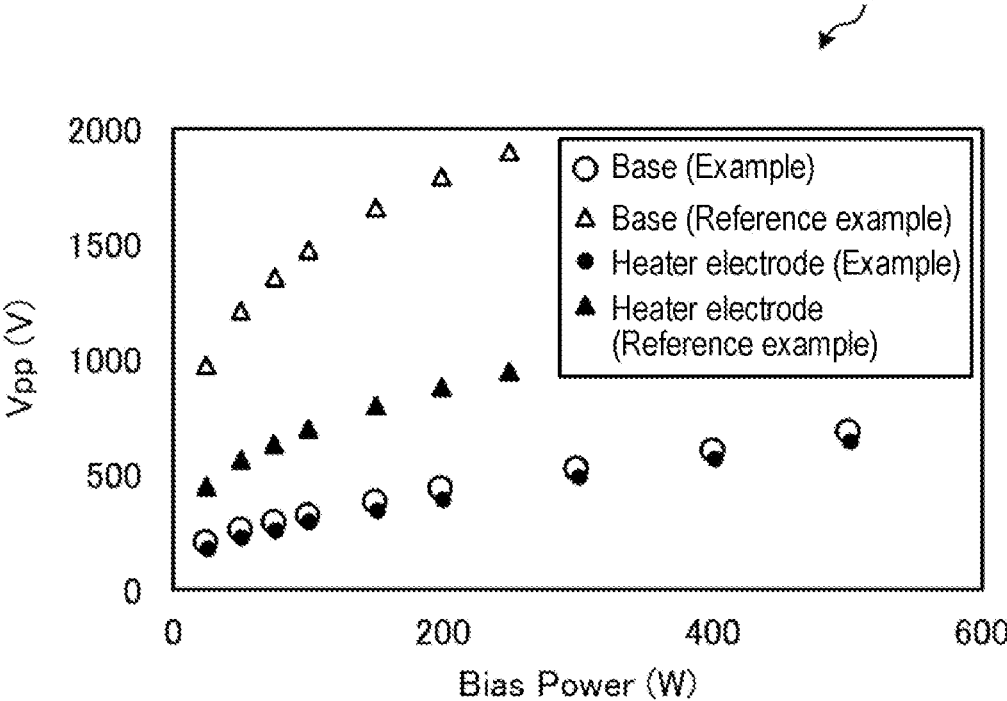
FIG. 3 is a diagram showing an example of experimental results of bias power supply.
Figure 4:
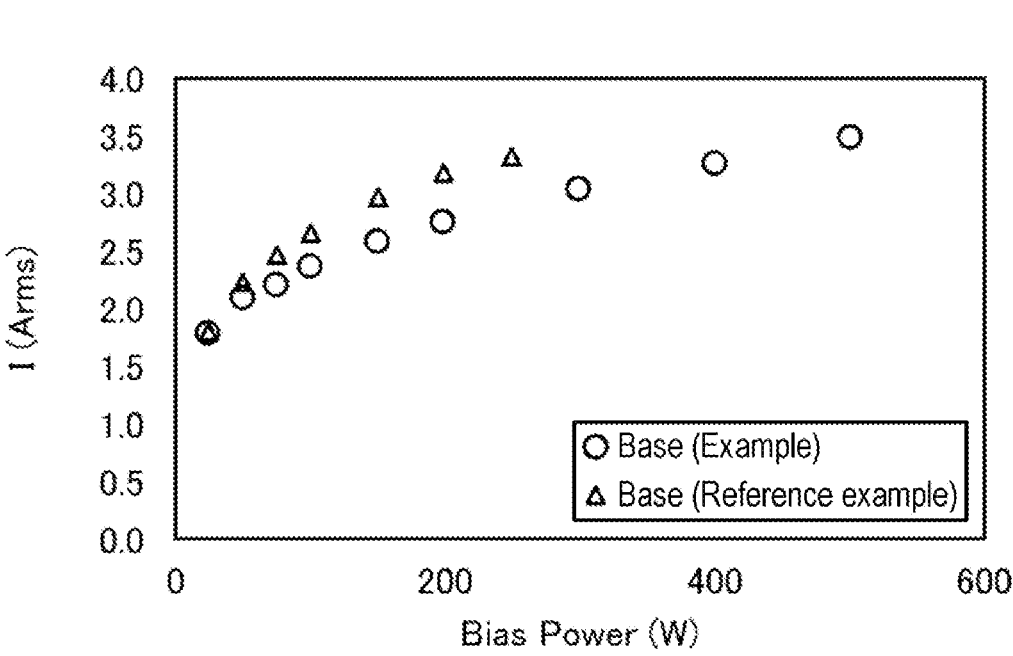
FIG. 4 is a diagram showing an example of experimental results of bias power supply.

Next, the results of experiments performed using the plasma processing apparatus 1 will be described with reference to FIGS. 3 to 5. FIGS. 3 and 4 are diagrams showing an example of experimental results of bias power supply. The graph 70 shown in FIG. 3 represents the electric potentials (Vpp) of the base 1110$h$ or the bias electrode 33 and the heater electrodes 1111*c* and 1111*h* in the reference example and the example of the present embodiment when the pressure inside the plasma processing chamber 10 is set to 15 mTorr (2.0 Pa), the 27 MHz source RF signal is supplied at 2500 W, and the 400 kHz bias RF signal is supplied at up to 500 W. In FIGS. 3 and 4, the bias electrode 33 of the example is indicated as a base for the sake of easy comparison. As shown in the graph 70, in the reference example, there is a large difference between the electric potential of the base 1110*h* and the electric potential of the heater electrode 1111*h*. An electric potential difference of about 800 V is generated when the bias RF signal is supplied at 250 W. On the other hand, in the present embodiment, it can be noted that even when the bias RF signal is supplied at 500 W, almost no electric potential difference occurs between the bias electrode 33 and the heater electrode 1111*c*. Further, in the present embodiment, it can be seen that when the power of the source RF signal is the same as in the reference example, the electric potentials of the base 1110 and the heater electrode 1111*c* are lower than in the reference example. Moreover, as shown in the graph 71 of FIG. 4, the current I in the base 1110*h* or the bias electrode 33 flows at 3.3 Arms when the bias RF signal is supplied at 250 W in the reference example, and flows at 3.5 Arms when the bias RF signal is supplied at 500 W in the example.

Next, the voltage and etching rate of each part in the reference example and the example of the present embodiment will be described with reference to FIG. 5. FIG. 5 is a diagram showing an example of experimental results of etching processes. In the table 72 shown in FIG. 5, the source RF signal is denoted as source power, and the bias RF signal is denoted as bias power. In addition, in the Table 72, the voltage of the bias electrode 33 of the example is represented as the voltage of the base for the sake of easy comparison. As shown in the Table 72, for example, when the 27 MHz source power is supplied at 2500 W and the 400 kHz bias power is supplied at 200 W, the voltage of the base 1110 (bias electrode 33) can be lowered by 25% from 1735 V in the reference example to 434 V in the example. Further, the electric potential of the heater electrode 1111*c* at this time can also be lowered by 47% from 861 V in the reference example to 407 V in the example. Furthermore, the etching rate at this time can be improved by 112% from 1104 nm/min in the reference example to 1235 nm/min in the example. Similarly, when the combination of the source power and the bias power is 800 W/50 W, 800 W/200 W, and 2500 W/50 W, the voltage of the base 1110 (bias electrode 33) can be lowered and the etching rate can be improved.

Similarly, for example, when the 27 MHz source power is supplied at 2500 W and the 13 MHz bias power is supplied at 900 W, the voltage of the base 1110 (bias electrode 33) can be lowered by 56% from 392 V in the reference example to 220 V in the example. Further, the electric potential of the heater electrode 1111*c* at this time can also be lowered by 95% from 15 V in the reference example to 14 V in the example. Furthermore, the etching rate at this time can be improved by 101% from 1998 nm/min in the reference example to 2012 nm/min in the example. Similarly, when the combination of the source power and the bias power is 800 W/900 W, the voltage of the base 1110 (bias electrode 33) can be lowered and the etching rate can be improved. In this manner, the substrate support 11 of the present embodiment can improve the efficiency of the bias power on the low frequency side.

[Connection to Bias Electrode]

Figure 6:
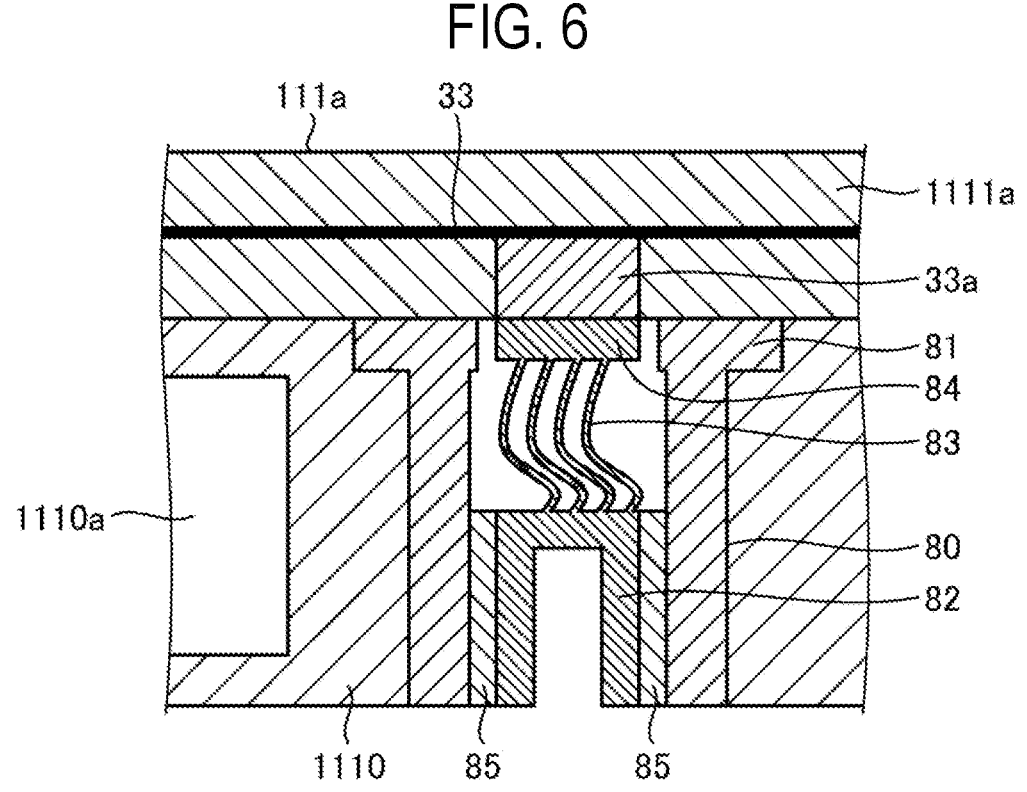
FIG. 6 is a diagram showing an example of connection to the bias electrode when the base and the bias electrode are electrically insulated.

Next, the details of the connection from the second RF generator 31*b* to the bias electrode will be described with reference to FIG. 6. FIG. 6 is a diagram showing an example of the connection to the bias electrode when the base and the bias electrode are electrically insulated. In the following description, the bias electrode 33 is used as an example of the bias electrode, and the electrostatic electrode 1111*b* and the heater electrode 1111*c* are omitted. Further, in FIG. 6, the base 1110 is assumed to be a conductive member. As shown in FIG. 6, an insulating sleeve 81 is provided in the through-hole 80 of the base 1110. A socket terminal 82 for power supply, a power supply line 83, and a joint terminal 84 are provided in the insulating sleeve 81. The socket terminal 82, the power supply line 83 and the joint terminal 84 are examples of the conductor 81*a*. The socket terminal 82 is secured to the insulating sleeve 81 with an adhesive 85. Further, the upper portion of the socket terminal 82 and the joint terminal 84 are connected by the power supply line 83. The joint terminal 84 is joined to the terminal 33*a* of the bias electrode 33. A cable (not shown) is connected to the socket terminal 82. The cable is connected to the second RF generator 31*b*. In addition, the through-hole 80 is arranged so as to avoid the flow path 1110*a* of the base 1110. In the example of the connection to the bias electrode 33 shown in FIG. 6, the base 1110 and the bias electrode 33 are electrically insulated by the ceramic member 1111*a* and the insulating sleeve 81.

[Modification 1]

In the above-described embodiment, the power supply line 83 is used in the insulating sleeve 81 for the connection to the bias electrode 33. However, the socket terminal 82 may be joined to the terminal 33*a* of the bias electrode 33. The embodiment in this case will be described as modification 1. The plasma processing apparatus according to modification 1 is the same as that of the above-described embodiment. Therefore, the redundant descriptions of the configuration and operation thereof will be omitted.

Figures 7, 8:
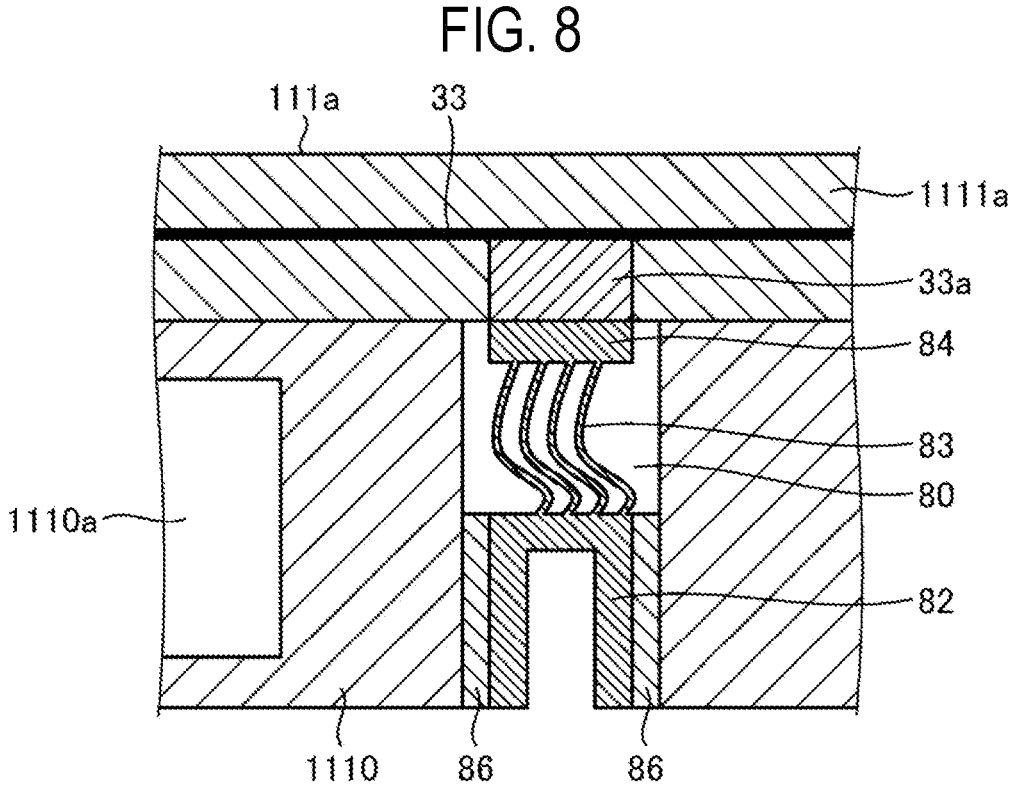
FIG. 7 is a diagram showing an example of connection to the bias electrode when the base and the bias electrode are electrically insulated in modification 1.
FIG. 8 is a diagram showing an example of connection to the bias electrode when the base and the bias electrode are electrically connected in modification 2.

FIG. 7 is a diagram showing an example of the connection to the bias electrode when the base and the bias electrode are electrically insulated in modification 1. In FIG. 7, the base 1110 is assumed to be a conductive member. As shown in FIG. 7, an insulating sleeve 81 is provided in the through-hole 80 of the base 1110, and a socket terminal 82*a* for power supply is provided in the insulating sleeve 81. The socket terminal 82*a* is an example of the conductor 81*a*. The socket terminal 82*a* is fixed to the insulating sleeve 81 with an adhesive 85*a*. Further, the upper portion of the socket terminal 82 a is joined to the terminal 33*a* of the bias electrode 33. A cable (not shown) is connected to the lower portion of the socket terminal 82*a*. The cable is connected to the second RF generator 31*b*. In addition, the through-hole 80 is arranged so as to avoid the flow path 1110*a* of the base 1110. In the example of the connection to the bias electrode 33 shown in FIG. 7, the base 1110 and the bias electrode 33 are electrically insulated by the ceramic member 1111*a* and the insulating sleeve 81.

[Modification 2]

In the above-described embodiment and modification 1, the base 1110 and the bias electrode 33 are electrically insulated. However, the base 1110 and the bias electrode 33 may be electrically connected. The embodiment in this case will be described as modification 2. The plasma processing apparatus according to modification 2 is the same as the plasma processing apparatus according to the above-described embodiment. Therefore, the redundant descriptions of the configuration and operation thereof will be omitted.

FIG. 8 is a diagram showing an example of the connection to the bias electrode when the base and the bias electrode are electrically connected in modification 2. In FIG. 8, the base 1110 is assumed to be a conductive member. As shown in FIG. 8, in the through-hole 80 of the base 1110, a socket terminal 82 for power supply, a power supply line 83, and a joint terminal 84 are provided. The socket terminal 82, the power supply line 83 and the joint terminal 84 are examples of the conductor 81*a*. The socket terminal 82 is fixed to the inner wall of the through-hole 80 with a conductive adhesive 86. As the adhesive 86, for example, a solder or an adhesive containing conductive paste may be used. Further, the upper portion of the socket terminal 82 and the joint terminal 84 are connected by the power supply line 83. The joint terminal 84 is joined to the terminal 33*a* of the bias electrode 33. A cable (not shown) is connected to the socket terminal 82. The cable is connected to the second RF generator 31*b*. In addition, the through-hole 80 is arranged so as to avoid the flow path 1110*a* of the base 1110. In the example of the connection to the bias electrode 33 shown in FIG. 8, the base 1110 and the bias electrode 33 are electrically connected by the adhesive 86, the socket terminal 82, the power supply line 83 and the joint terminal 84. That is, in modification 2, the base 1110 and the bias electrode 33 have the same electric potential. Therefore, it is possible to suppress electric discharge in the through-holes 80 and the heat transfer gas supply hole (not shown). In addition, since the diameter of the through-hole 80 can be reduced without having to use the insulating sleeve 81 and the adhesive 85 or 85*a* having different heat conduction characteristics, it is possible to suppress the change in heat dissipation from the surroundings, and suppress the occurrence of hot spots on the substrate W. Furthermore, the process of providing the insulating sleeve 81 can be omitted.

[Modification 3]

In modification 2 described above, the power supply line 83 is used in the through-hole 80 for the connection to the bias electrode 33. However, the socket terminal 82 may be joined to the terminal 33*a* of the bias electrode 33. The embodiment in this case will be described as modification 3. The plasma processing apparatus according to modification 3 is the same as the plasma processing apparatus according to the above-described embodiment. Therefore, the redundant descriptions of the configuration and operation thereof will be omitted.

Figure 9:
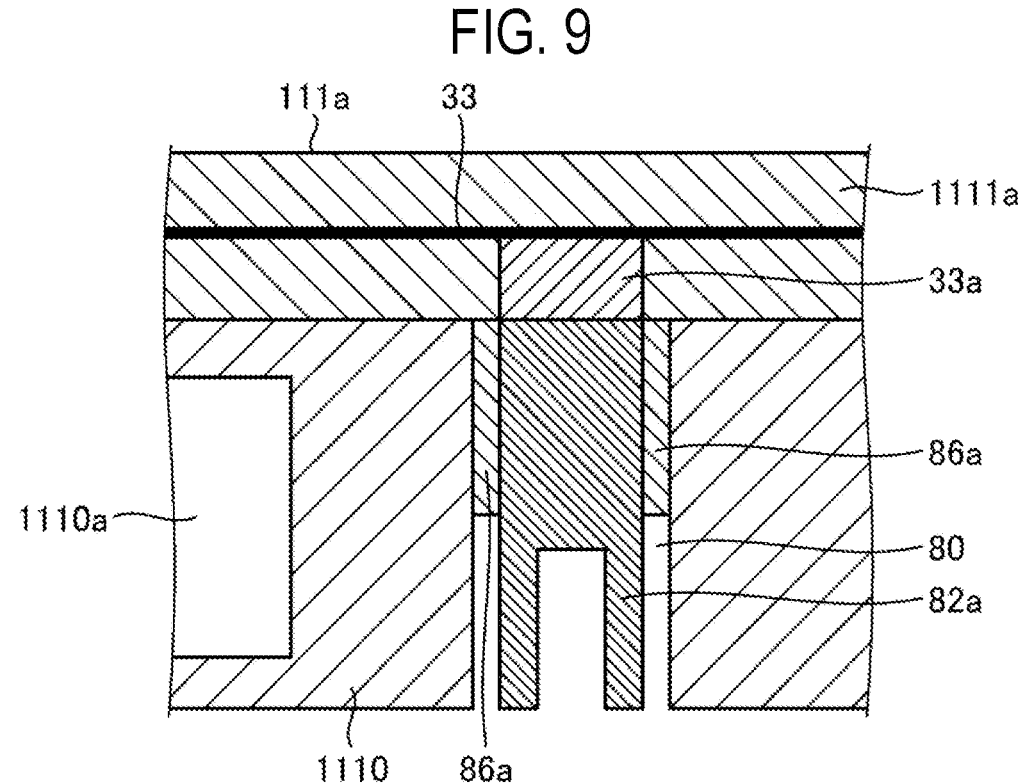
FIG. 9 is a diagram showing an example of connection to the bias electrode when the base and the bias electrode are electrically connected in modification 3.

FIG. 9 is a diagram showing an example of the connection to the bias electrode when the base and the bias electrode are electrically connected in modification 3. In FIG. 9, the base 1110 is assumed to be a conductive member. As shown in FIG. 9, in the through-hole 80 of the base 1110, a socket terminal 82*a* for power supply is provided. The socket terminal 82*a* is an example of the conductor 81*a*. The socket terminal 82*a* is fixed to the inner wall of the through-hole 80 with a conductive adhesive 86*a*. The upper portion of the socket terminal 82*a* is joined to the terminal 33*a* of the bias electrode 33. A cable (not shown) is connected to the lower portion of the socket terminal 82*a*. The cable is connected to the second RF generator 31*b*. In addition, the through-hole 80 is arranged so as to avoid the flow path 1110*a* of the base 1110. In the example of the connection to the bias electrode 33 shown in FIG. 9, the base 1110 and the bias electrode 33 are electrically connected by the adhesive 86*a* and the socket terminal 82*a*. That is, in modification 3, the base 1110 and the bias electrode 33 have the same electric potential. Therefore, it is possible to suppress electric discharge in the through-hole 80 and the heat transfer gas supply hole (not shown). In addition, since the diameter of the through-hole 80 can be reduced without having to use the insulating sleeve 81 and the adhesive 85 or 85*a* having different heat conduction characteristics, it is possible to suppress the change in heat dissipation from the surroundings, and suppress the occurrence of hot spots on the substrate W. Furthermore, the process of providing the insulating sleeve 81 can be omitted.

[Image of Electric Potential]

Figure 10:
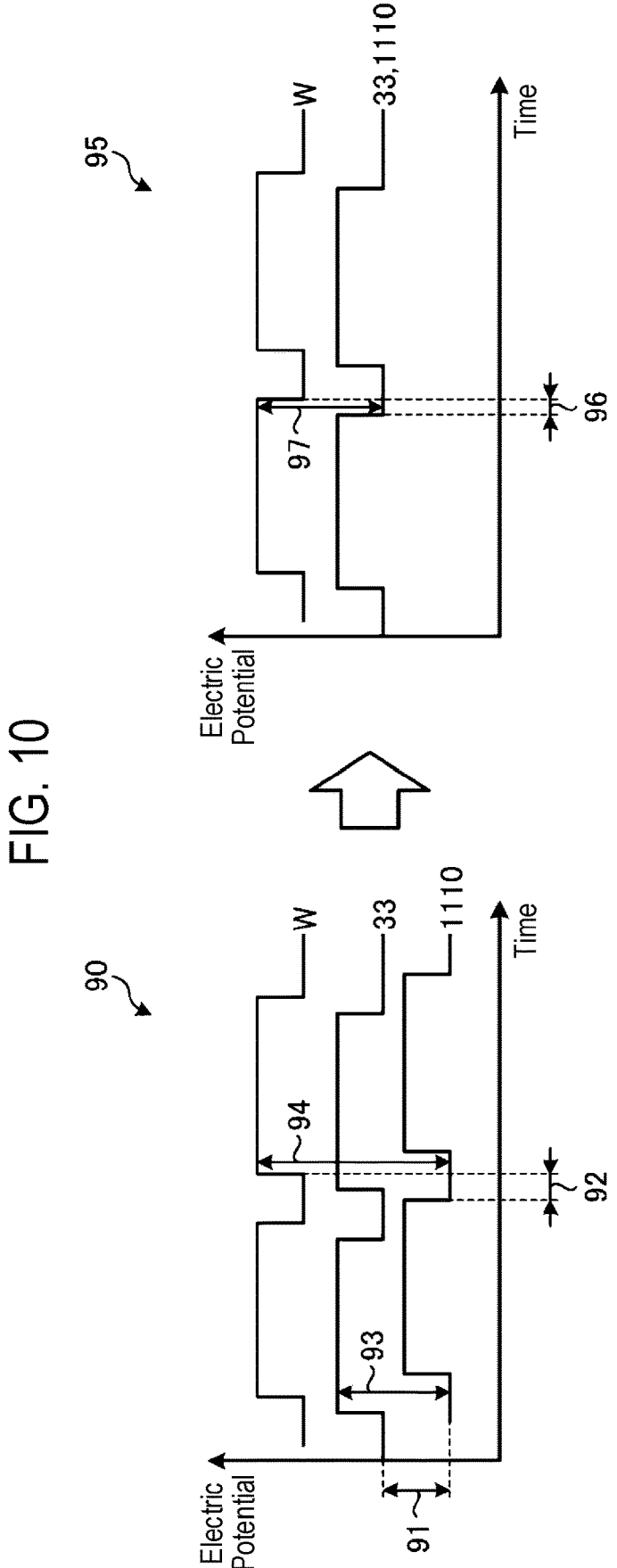
FIG. 10 is a diagram showing an example of an image of electric potentials on the base, the bias electrode, and the substrate.

Now, an image of each electric potential in a case where the base 1110 and the bias electrode 33 shown in FIGS. 6 and 7 are electrically insulated and a case where the base 1110 and the bias electrode 33 shown in FIGS. 8 and 9 are electrically connected will be described with reference to FIG. 10. FIG. 10 is a diagram showing an example of an image of each electric potential on the base, the bias electrode, and the substrate. The graph 90 shown in FIG. 10 is an image of the electric potential of each part when the base 1110 and the bias electrode 33 are electrically insulated. As shown in the graph 90, when the base 1110 and the bias electrode 33 are electrically insulated, an electric potential difference 91 is generated between the base 1110 and the bias electrode 33. Further, a voltage phase difference 92 is generated between the base 1110, the bias electrode 33 and the substrate W due to the impedance of each part of the substrate support 11. Due to the generation of the phase difference 92, a large electric potential differences such as an electric potential difference 93 between the base 1110 and the bias electrode 33 and an electric potential difference 94 between the base 1110 and the substrate W is generated temporarily.

The graph 95 shown in FIG. 10 is an image of the electric potential of each part when the base 1110 and the bias electrode 33 are electrically connected. As shown in the graph 95, when the base 1110 and the bias electrode 33 are electrically connected, there is no electric potential difference between the base 1110 and the bias electrode 33 which have the same electric potential. Further, a voltage phase difference 96 is generated between the base 1110 and the bias electrode 33 and the substrate W due to the impedance of each part of the substrate support 11. An electric potential difference 97 between the substrate W and the base 1110 and the bias electrode 33 due to the phase difference 96 is smaller than the electric potential difference 94 shown in the graph 90. As a result, it is possible to suppress electric discharge in the heat transfer gas and dielectric breakdown between the power supply line and the base 1110. Moreover, since the base 1110 and the bias electrode 33 are electrically connected, it is possible to suppress the electric potential difference when supplying the source RF signal to the base 1110. Furthermore, since the impedance between the bias electrode 33 and the substrate W is reduced, it is also possible to reduce the voltage phase difference.

[Modifications 4 to 6]

In modifications 2 and 3 described above, the socket terminal 82 and the like corresponding to the conductor 81*a* are provided in the through-hole 80. However, other connection methods may be used. The embodiments in this case will be described as modifications 4 to 6. The plasma processing apparatuses according to modifications 4 to 6 are the same as the plasma processing apparatus according to the above-described embodiment. Therefore, the redundant descriptions of the configurations and operations thereof will be omitted.

Figure 11:
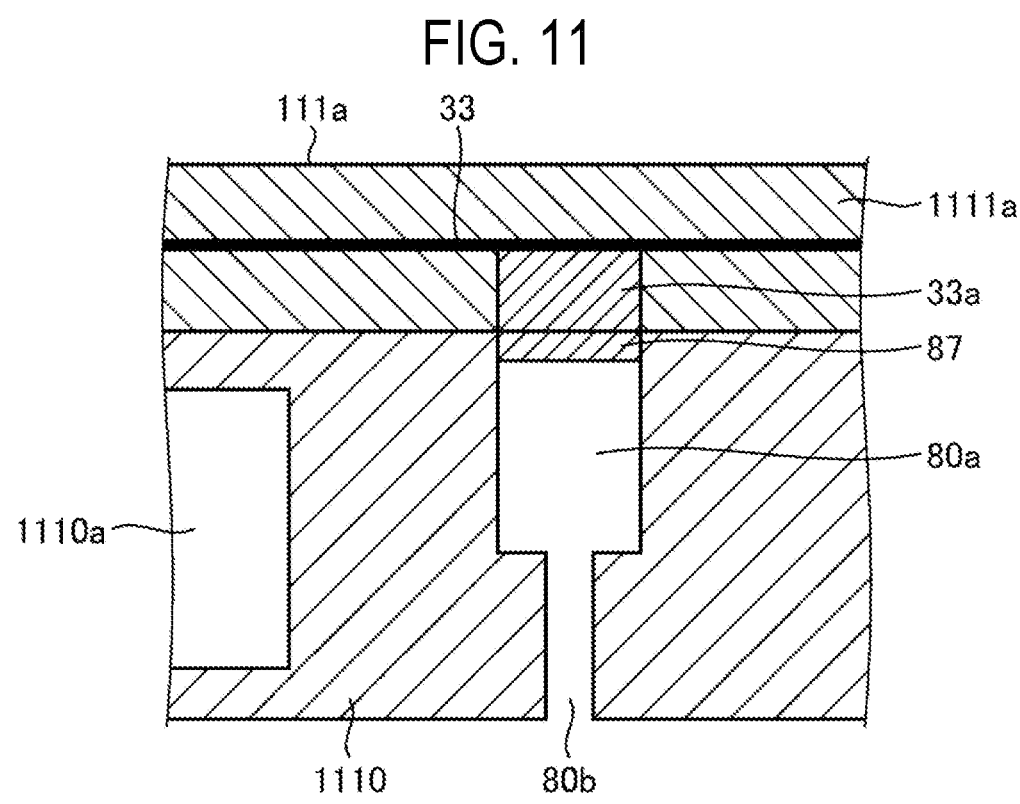
FIG. 11 is a diagram showing an example of connection to the bias electrode when the base and the bias electrode are electrically connected in modification 4.

FIG. 11 is a diagram showing an example of the connection to the bias electrode when the base and the bias electrode are electrically connected in modification 4. In FIG. 11, the base 1110 is assumed to be a conductive member. As shown in FIG. 11, the base 1110 is provided with an upper hole 80*a* and a lower hole 80*b* having a smaller diameter than the upper hole 80*a*. The holes 80*a* and 80b are connected to form a through-hole. The holes 80a and 80b may not be connected, and may be provided independently. The upper portion of the hole 80a is fixed with a conductive adhesive 87 so that the terminal 33a of the bias electrode 33 and the side surface of the hole 80a are electrically connected. As the adhesive 87, for example, a solder, an adhesive containing conductive paste, a sintered silver, a brazing material, or the like may be used. A cable (not shown) is connected to the hole 80b. The cable is connected to the second RF generator 31b. An existing hole may be substituted for the hole 80b, and the position on the lower surface side of the base 1110 is not limited. The holes 80a and 80b are arranged so as to avoid the flow path 1110a of the base 1110. In the example of the connection to the bias electrode 33 shown in FIG. 11, the base 1110 and the bias electrode 33 are electrically connected by an adhesive 87. That is, in modification 4, the base 1110 and the bias electrode 33 have the same electric potential. Therefore, it is possible to suppress electric discharge in the holes 80a and 80b and the heat transfer gas supply hole (not shown). In addition, since the diameter of the hole 80a can be reduced without having to use the insulating sleeve 81 and the adhesive 85 or 85a having different heat conduction characteristics, it is possible to reduce the change in heat dissipation from the surroundings, and suppress the occurrence of hot spots on the substrate W. Furthermore, the process of providing the insulating sleeve 81 can be omitted.

Figure 12:
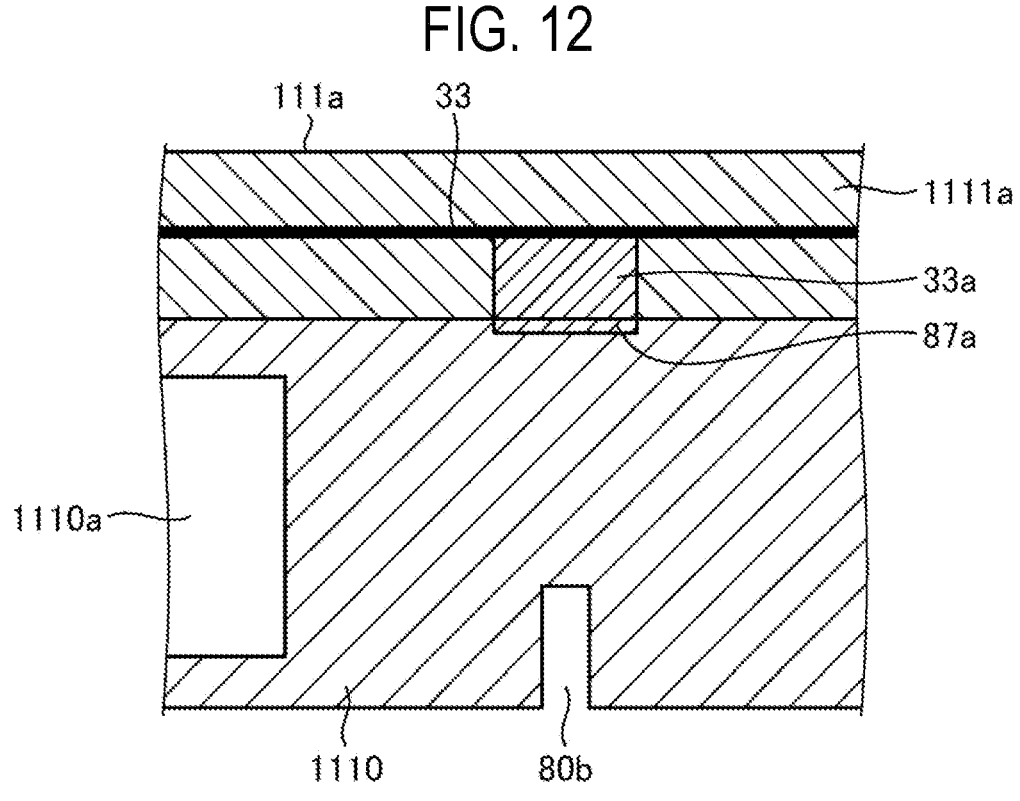
FIG. 12 is a diagram showing an example of connection to the bias electrode when the base and the bias electrode are electrically connected in modification 5.

FIG. 12 is a diagram showing an example of the connection to the bias electrode when the base and the bias electrode are electrically connected in modification 5. In FIG. 12, the base 1110 is assumed to be a conductive member. As shown in FIG. 12, the base 1110 is provided with a hole 80b on the bottom side. A leaf spring 87a for contacting the terminal 33a of the bias electrode 33 is provided on the upper surface side of the base 1110 corresponding to the hole 80b. The hole 80b and the leaf spring 87a do not have to be provided at corresponding positions to each other. The leaf spring 87a is an electrical contact that connects the base 1110 and the terminal 33a. The leaf spring 87a may be in another form such as a coil spring or the like as long as it functions as an electrical contact. A cable (not shown) is connected to the hole 80b. The cable is connected to the second RF generator 31b. An existing hole may be substituted for the hole 80b, and the position on the lower surface side of the base 1110 is not limited. The hole 80b is arranged so as to avoid the flow path 1110a of the base 1110. In the example of the connection to the bias electrode 33 shown in FIG. 12, the base 1110 and the bias electrode 33 are electrically connected by the leaf spring 87a. That is, in modification 5, the base 1110 and the bias electrode 33 have the same electric potential. Therefore, it is possible to suppress electric discharge in the hole 80b and the heat transfer gas supply hole (not shown). Moreover, since no hole is provided on the upper surface side of the base 1110, it is possible to suppress the occurrence of hot spots on the substrate W. Furthermore, the process of providing the insulating sleeve 81 can be omitted.

Figure 13:
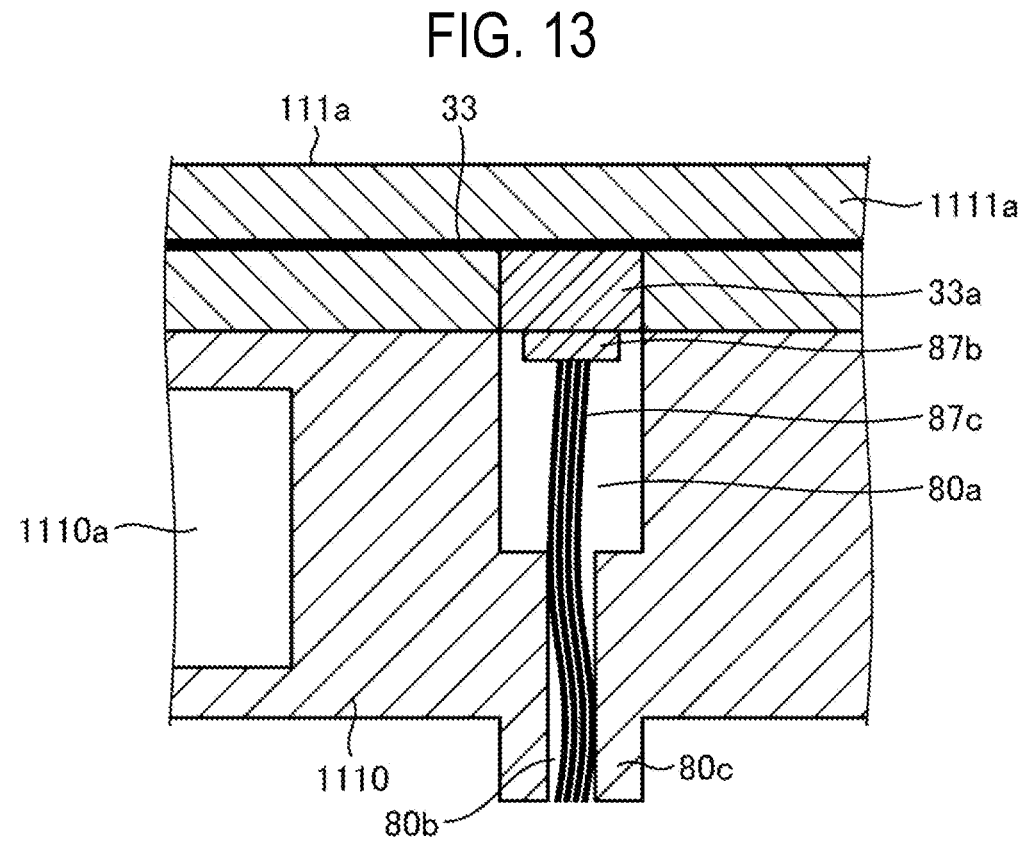
FIG. 13 is a diagram showing an example of connection to the bias electrode when the base and the bias electrode are electrically connected in modification 6.

FIG. 13 is a diagram showing an example of the connection to the bias electrode when the base and the bias electrode are electrically connected in modification 6. In FIG. 13, the base 1110 is assumed to be a conductive member. As shown in FIG. 13, the base 1110 is provided with an upper hole 80a, a lower hole 80b having a smaller diameter than the upper hole 80a, and a caulking portion 80c. The holes 80a and 80b are connected to form a through-hole. A joint terminal 87b and a power supply line 87c are provided inside the holes 80a and 80b. The joint terminal 87b is joined to the terminal 33a of the bias electrode 33. The power supply line 87c is electrically connected at its upper end to the joint terminal 87b and is electrically connected at its lower end to the base 1110 as the caulking portion 80c is caulked. A cable (not shown) is connected to the caulking portion 80c. The cable is connected to the second RF generator 31b. An existing hole and an existing caulking portion may be substituted for the hole 80b and the caulking portion 80c, and the position on the lower surface side of the base 1110 is not limited. The holes 80a and 80b and the caulking portion 80c are arranged so as to avoid the flow path 1110a of the base 1110. In the example of the connection to the bias electrode 33 shown in FIG. 13, the base 1110 and the bias electrode 33 are electrically connected by the caulking portion 80c, the power supply line 87c and the joint terminal 87b. That is, in modification 6, the base 1110 and the bias electrode 33 have the same electric potential. Therefore, it is possible to suppress electric discharge in the holes 80a and 80b and the heat transfer gas supply hole (not shown). In addition, since the diameter of the hole 80a can be reduced without having to use the insulating sleeve 81 and the adhesive 85 or 85a having different heat conduction characteristics, it is possible to reduce the change in heat dissipation from the surroundings, and suppress the occurrence of hot spots on the substrate W. Furthermore, the process of providing the insulating sleeve 81 can be omitted.

[Modification 7]

In the above-described embodiment and modifications 1 to 6, the conductive member is used for the base 1110. However, the base 1110 may be made of a dielectric material. The embodiment in this case will be described as modification 7. Since the plasma processing apparatus according to modification 7 is the same as the substrate processing apparatus according to the above-described embodiment, the redundant descriptions of the configuration and operation thereof will be omitted.

In modification 7, the adhesive layer 1112 of the body portion 111 is made conductive, and only the terminal 33a of the bias electrode 33 is surrounded by an insulator. For example, a socket terminal similar to the socket terminal 82a of modification 3 is joined to the terminal 33a. A cable extending from the second RF generator 31b is electrically connected to the socket terminal. In this case, the adhesive layer 1112 and the bias electrode 33 are electrically insulated. In modification 7, for example, a socket terminal similar to the socket terminal 82a of modification 3 is joined to the adhesive layer 1112, and a cable extending from the second RF generator 31b is electrically connected to the socket terminal. The adhesive layer 1112 and the bias electrode 33 are joined at the terminal 33a. In this case, the adhesive layer 1112 and the bias electrode 33 are electrically connected and have the same electric potential. Regardless of whether the adhesive layer 1112 and the bias electrode 33 are electrically insulated or connected, the efficiency of the bias power on the low frequency side can be improved as in the above-described embodiment. Further, when the adhesive layer 1112 and the bias electrode 33 are electrically connected, it is possible to suppress electric discharge in the through-hole 80 and the heat transfer gas supply hole (not shown).

Second Embodiment

In the above-described first embodiment, a single-layer electrode is used as the bias electrode 33. However, a bias electrode having a plurality of layers may be used. The embodiment of a bias electrode having a plurality of layers will be described as a second embodiment. The plasma processing apparatus according to the second embodiment is the same as the substrate processing apparatus according to the above-described first embodiment except for the arrangement of various electrodes in the electrostatic chuck 1111. Therefore, the redundant descriptions of the configuration and operation thereof will be omitted.

Figure 14:
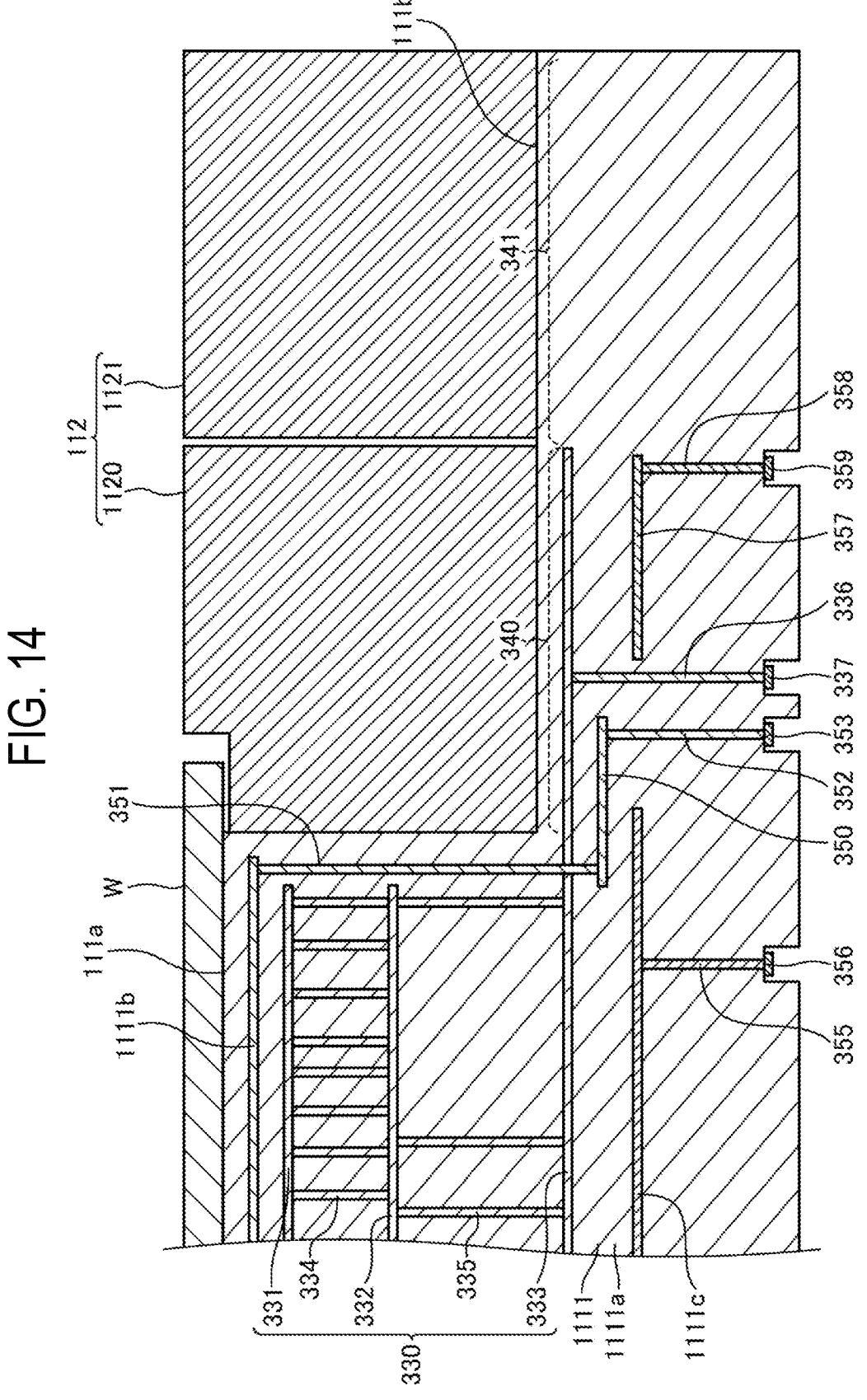
FIG. 14 is a partial sectional view showing an example of the electrostatic chuck according to a second embodiment.

FIG. 14 is a partial sectional view showing an example of an electrostatic chuck according to the second embodiment. As shown in FIG. 14, in the second embodiment, a bias electrode 330 composed of a first layer 331, a second layer 332 and a third layer 333 is provided instead of the bias electrode 33 of the first embodiment. Further, in the second embodiment, instead of the bias electrode 34 of the first embodiment, the third layer 333 extends to the region 340. The bias electrode 330 may be further supplied with source power for plasma generation.

In the central region 111a of the ceramic member 1111a, the electrostatic electrode 1111b, the first layer 331, the second layer 332 and the third layer 333 of the bias electrode 330, the supply layer 350 to the electrostatic electrode 1111b, and the heater electrode 1111c are provided sequentially from the central region 111a side, The electrostatic electrode 1111b is connected to the supply layer 350 with a plurality of vias 351. The supply layer 350 is connected to the terminal 353 through a via 352.

In the bias electrode 330, the first layer 331 and the second layer 332 are connected by a plurality of vias 334, and the second layer 332 and the third layer 333 are connected by a plurality of vias 335. The third layer 333 is connected to a terminal 337 through a via 336. The terminal 337 corresponds to the terminal 33a of the first embodiment. The bias electrode 330 is an example of the second electrode. The first layer 331 and the second layer 332 are examples of the first layer and the second layer. Either one of the second layer 332 and the third layer 333 may be omitted. For example, if the second layer 332 is omitted, the third layer 333 is an example of the second layer. Further, the first layer 331 functions as the bias electrode 330 in the central region 111a. In this case, the second layer 332 and the third layer 333 supply RF signals (RF power) supplied from the RF power supply 31 to the first layer 331 from a plurality of locations, thereby functioning to level the electric field distribution in the first layer 331. That is, by providing the second layer 332 and the third layer 333, it is possible to improve the in-plane uniformity of plasma processing. The heater electrode 1111c is connected to a terminal 356 through a via 355.

In the annular region 111b of the ceramic member 1111a, a third bias electrode layer 333, a supply layer 350, and a heater electrode 357 are provided sequentially from the annular region 111b side. That is, as shown in FIG. 14, the ceramic member 1111a, which is a dielectric material, is arranged between the electrodes and between the layers in the electrostatic chuck 1111 of the second embodiment. An edge ring 1120 and a cover ring 1121 are placed as the ring assembly 112 on the annular region 111b. The edge ring 1120 is made of, for example, a conductive member (conductive material) such as silicon or silicon carbide, or a semiconductor. The cover ring 1121 is made of, for example, a dielectric material (insulating material) such as quartz or the like. That is, the annular region 111b, which is an example of the second support surface, supports the edge ring 1120 made of a conductive member and the cover ring 1121 made of a dielectric material. In addition, the region 340 of the third layer 333, which is an example of a fourth electrode, is arranged in the electrostatic chuck 1111 corresponding to the edge ring 1120, and is not arranged in the electrostatic chuck 1111 of the region 341 corresponding to the cover ring 1121.

In the annular region 111b, the region 340 of the third layer 333 functions as a bias electrode. That is, in the second embodiment, a part of the bias electrode in the central region 111a and the bias electrode in the annular region 111b are integrated. In addition, in the annular region 111b, the supply layer 350 also has the effect of attracting the edge ring 1120 instead of the electrostatic electrode 1111d of the first embodiment. The heater electrode 357 is connected to a terminal 359 through a via 358. The heater electrode 357 is an example of a temperature adjustment module and is configured to adjust the temperature of the edge ring 1120 to a target temperature.

Figure 15:
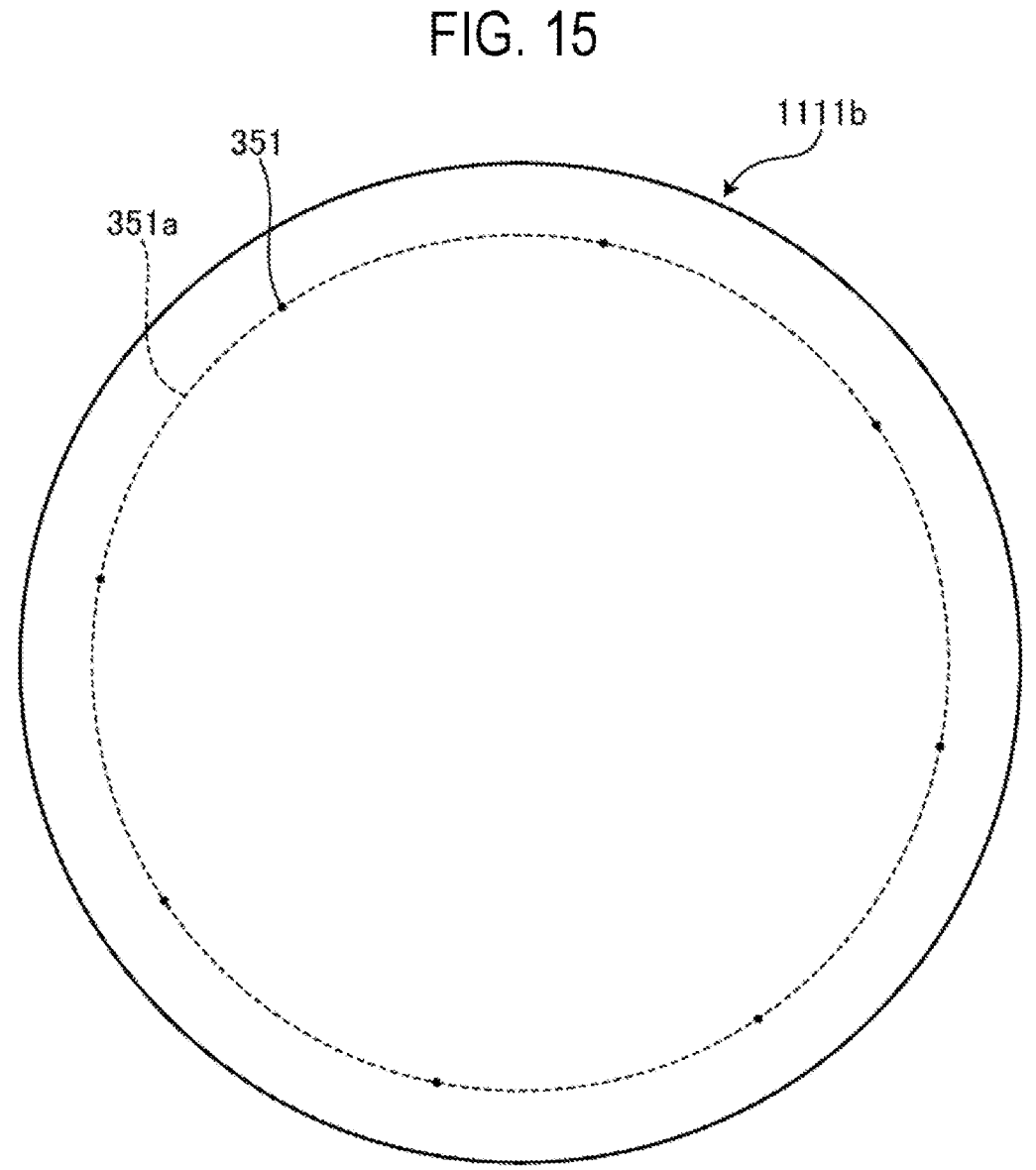
FIG. 15 is a sectional view showing an example of the electrostatic electrode as seen in a plan view.

Next, the respective cross sections of the electrostatic electrode 1111b, the first layer 331, the second layer 332, the third layer 333, and the supply layer 350 of the electrostatic chuck 1111 in a plan view will be described with reference to FIGS. 15 to 19. In FIGS. 15 to 19, in order to make the structures of the via and the like easier to see, the hatching representing the cross section is omitted except for a part thereof. FIG. 15 is a sectional view showing an example of the electrostatic electrode in a plan view. As shown in FIG. 15, the electrostatic electrode 1111b is formed in a disc shape corresponding to the central region 111a. The electrostatic electrode 1111b has a thickness of, for example, 10 µm to 20 µm. In the electrostatic electrode 1111b, for example, 16 vias 351 are arranged at equal intervals on the circumference 351a. The electrostatic electrode 1111b is electrically connected to the supply layer 350 through each via 351. In addition, the distance from the upper surface of the central region 111a to the electrostatic electrode 1111b (the thickness of the ceramic member 1111a) may be set to, for example, 0.35 mm.

Figure 16:
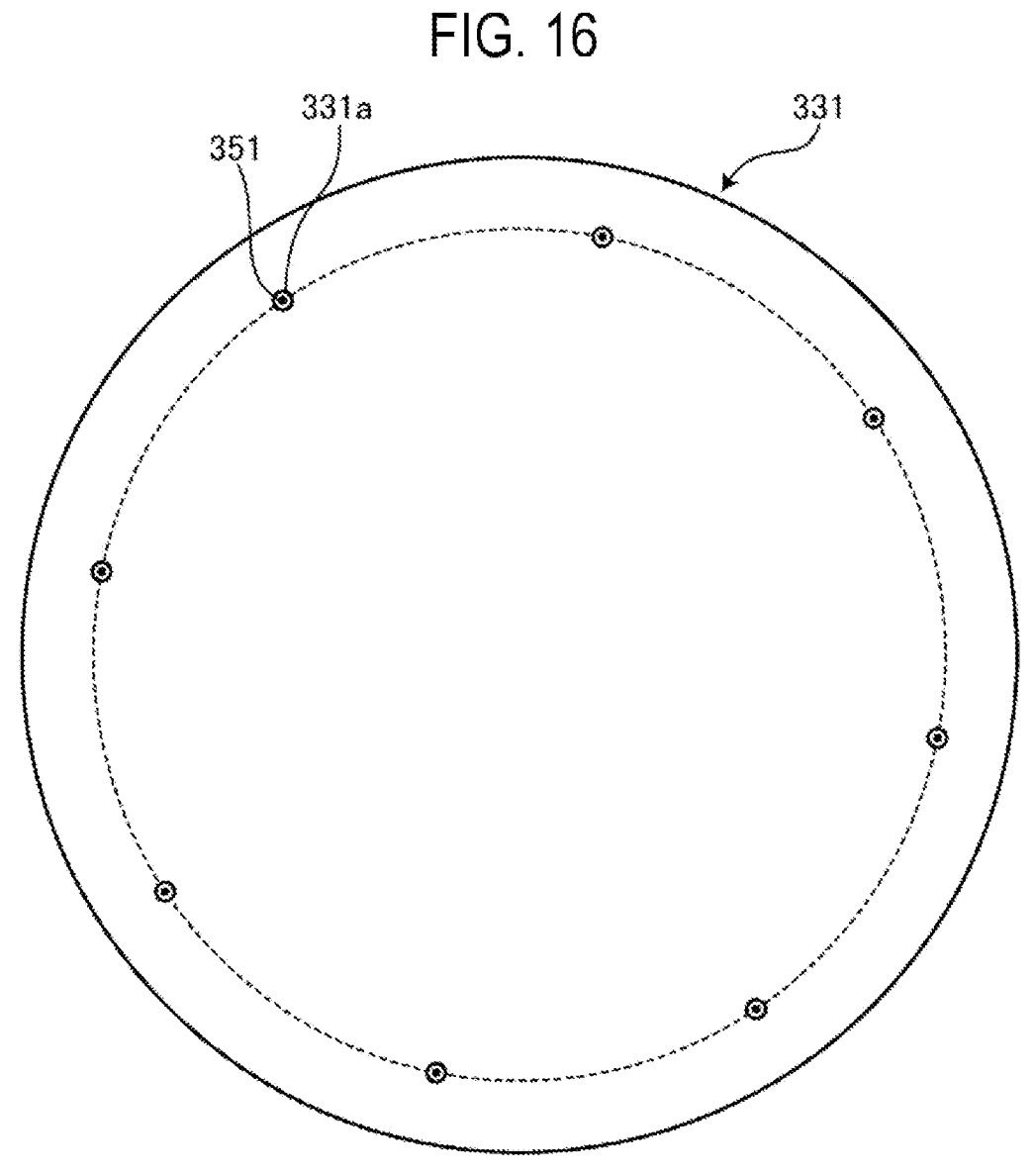
FIG. 16 is a sectional view showing an example of the first layer of the bias electrode as seen in a plan view.

FIG. 16 is a sectional view showing an example of the first layer of the bias electrode in a plan view. As shown in FIG. 16, the first layer 331 is formed in a disk shape corresponding to the central region 111a. The first layer 331 has a thickness of, for example, 10 µm to 20 µm. Each region 331a through which each via 351 penetrates is not provided with the first layer 331 so that each via 351 and the first layer 331 are not electrically connected. That is, in the region 331a, each via 351 and the first layer 331 are insulated by the ceramic member 1111a. Further, the distance from the electrostatic electrode 1111b to the first layer 331 (the thickness of the ceramic member 1111a) may be set to, for example, 0.35 mm. That is, the distance from the upper surface of the central region 111a to the first layer 331 may be set to, for example, approximately 0.7 mm. This distance is less than the distance (e.g., about 5 mm) from the first layer 331 to the upper surface of the base 1110.

Figure 17:
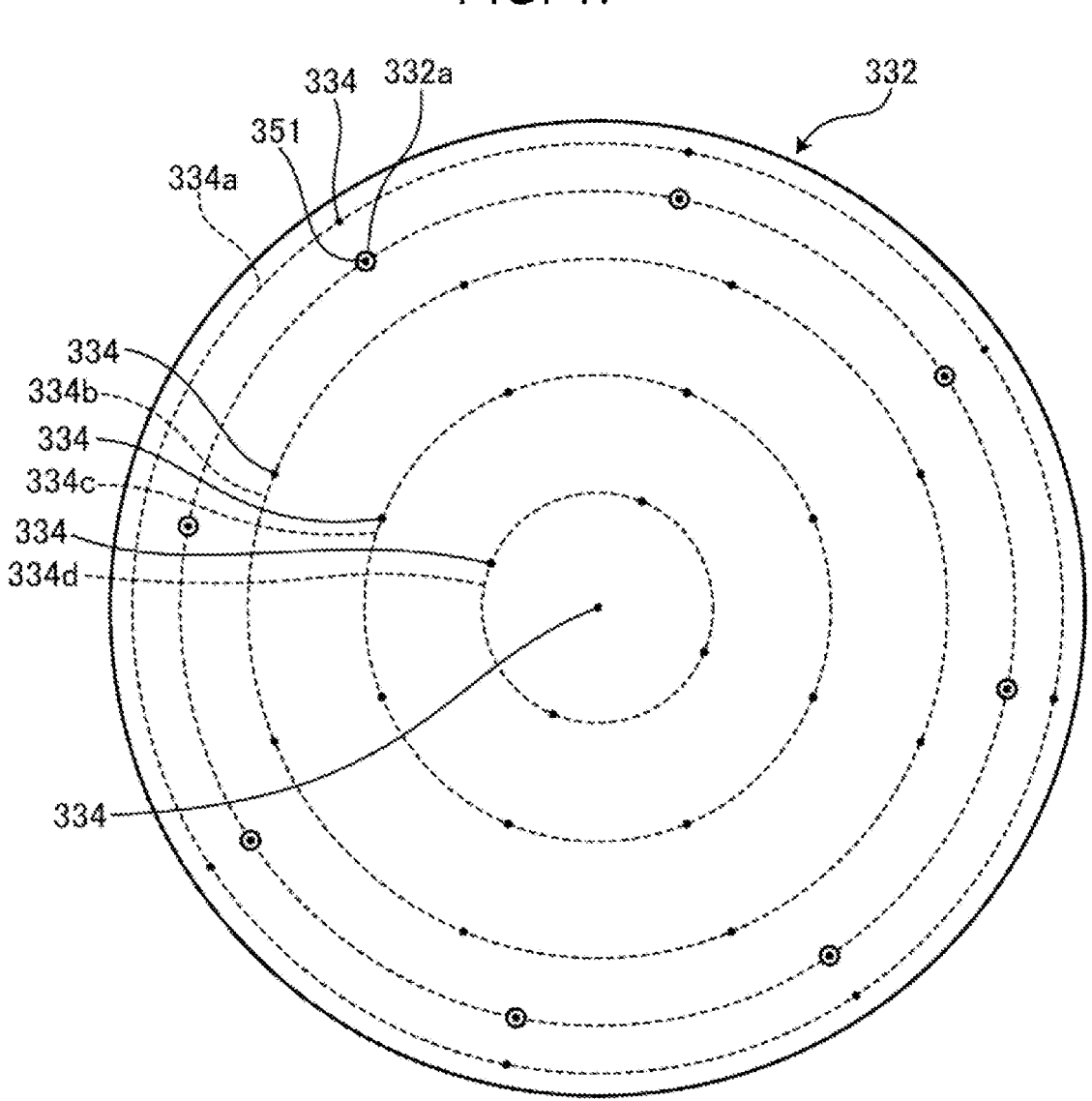
FIG. 17 is a sectional view showing an example of the second layer of the bias electrode as seen in a plan view.

FIG. 17 is a sectional view showing an example of the second layer of the bias electrode in a plan view. As shown in FIG. 17, the second layer 332 is formed in a disk shape corresponding to the central region 111a. The second layer 332 has a thickness of, for example, 10 µm to 20 µm. Each region 332a through which each via 351 penetrates is not provided with the second layer 332 so that each via 351 and the second layer 332 are not electrically connected. That is, in the region 332a, the via 351 and the second layer 332 are insulated by the ceramic member 1111a. In the second layer 332, for example, 16 vias 334 are arranged at equal intervals on each of circumferences 334a to 334c, which are concentric circles, 8 vias 334 are arranged at equal intervals on a circumference 334d, and one via 334 is arranged at the center of the second layer 332. The second layer 332 is electrically connected to the first layer 331 through each via 334.

Figure 18:
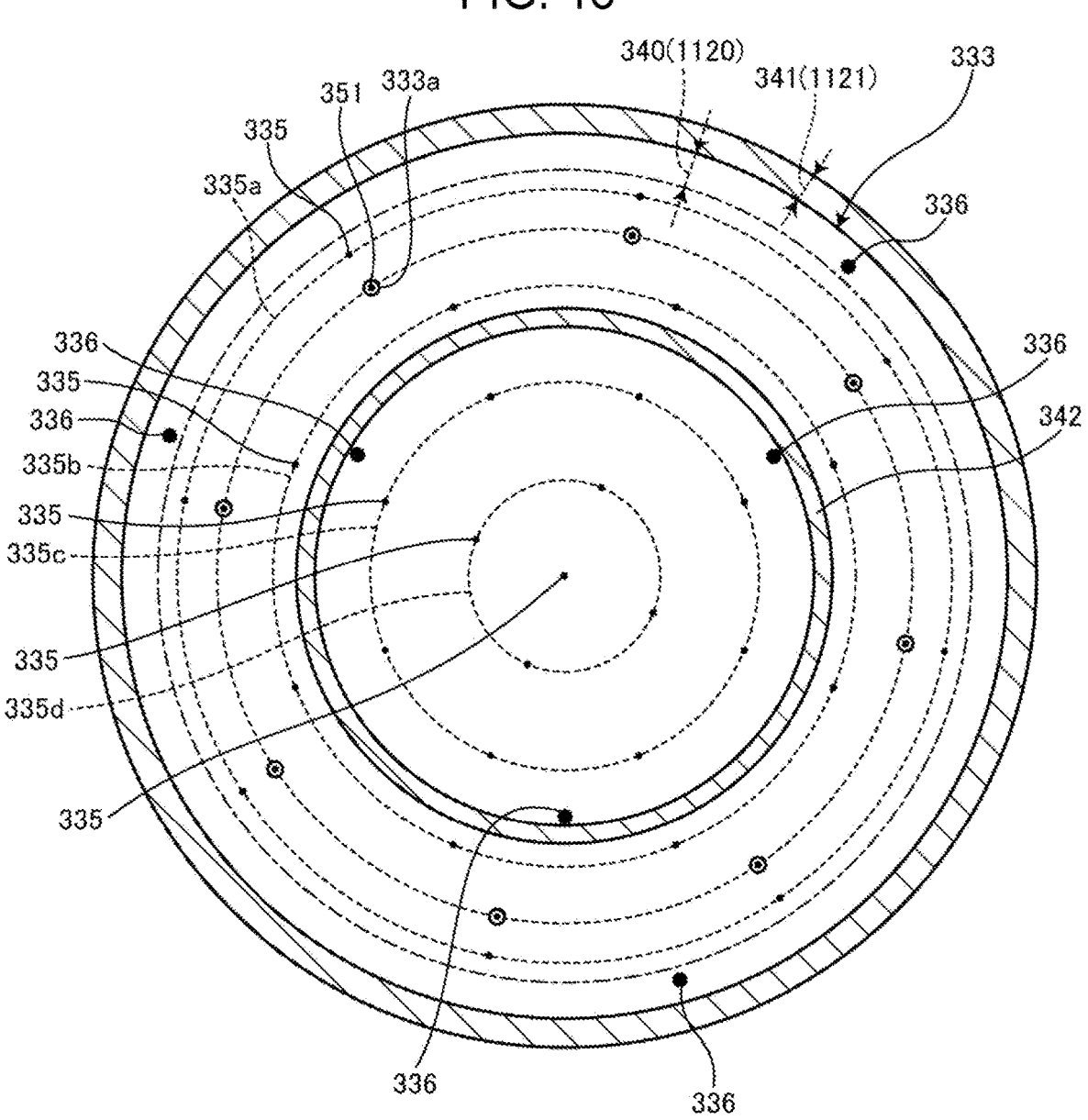
FIG. 18 is a sectional view showing an example of the third layer of the bias electrode as seen in a plan view.

FIG. 18 is a sectional view showing an example of the third layer of the bias electrode in a plan view. As shown in FIG. 18, the third layer 333 is formed in a disk shape corresponding to the central region 111a and the region of the annular region 111b where the edge ring 1120 is placed (corresponding to the region 340 in FIG. 14). The third layer 333 is not formed in the region of the annular region 111b where the cover ring 1121 is placed (corresponding to the region 341 in FIG. 14). Further, the third layer 333 is divided into an inner peripheral side and an outer peripheral side by a ring-shaped region 342 at substantially the center in the radial direction. In FIG. 18, the portion corresponding to the region 341 on which the outermost cover ring 1121 is placed and the region 342 are hatched so as to be easily distinguished from the third layer 333. The inner peripheral side and the outer peripheral side of the third layer 333 are electrically connected via each via 335 and the second layer 332. The third layer 333 has a thickness of, for example, 10 μm to 20 μm. Each region 333a through which each via 351 penetrates is not provided with the third layer 333 so that each via 351 and the third layer 333 are not electrically connected. That is, in the region 333a, each via 351 and the third layer 333 are insulated by the ceramic member 1111a. In the third layer 333, for example, 16 vias 335 are arranged at equal intervals on each of circumferences 335a to 335c, which are concentric circles, 8 vias 335 are arranged at equal intervals on a circumference 335d, and one via 335 is arranged at the center of the third layer 333. That is, each via 335 may be provided at the same position as each via 334. Each via 335 may be located at a different position and in a different number from each via 334. Further, in the third layer 333, for example, three vias 336 for electrical connection to the terminals 337 are arranged on the inner peripheral side, and three vias 336 for electrical connection to the terminals 337 are arranged on the outer peripheral side. That is, a plurality of terminals 337 may be provided.

Figure 19:
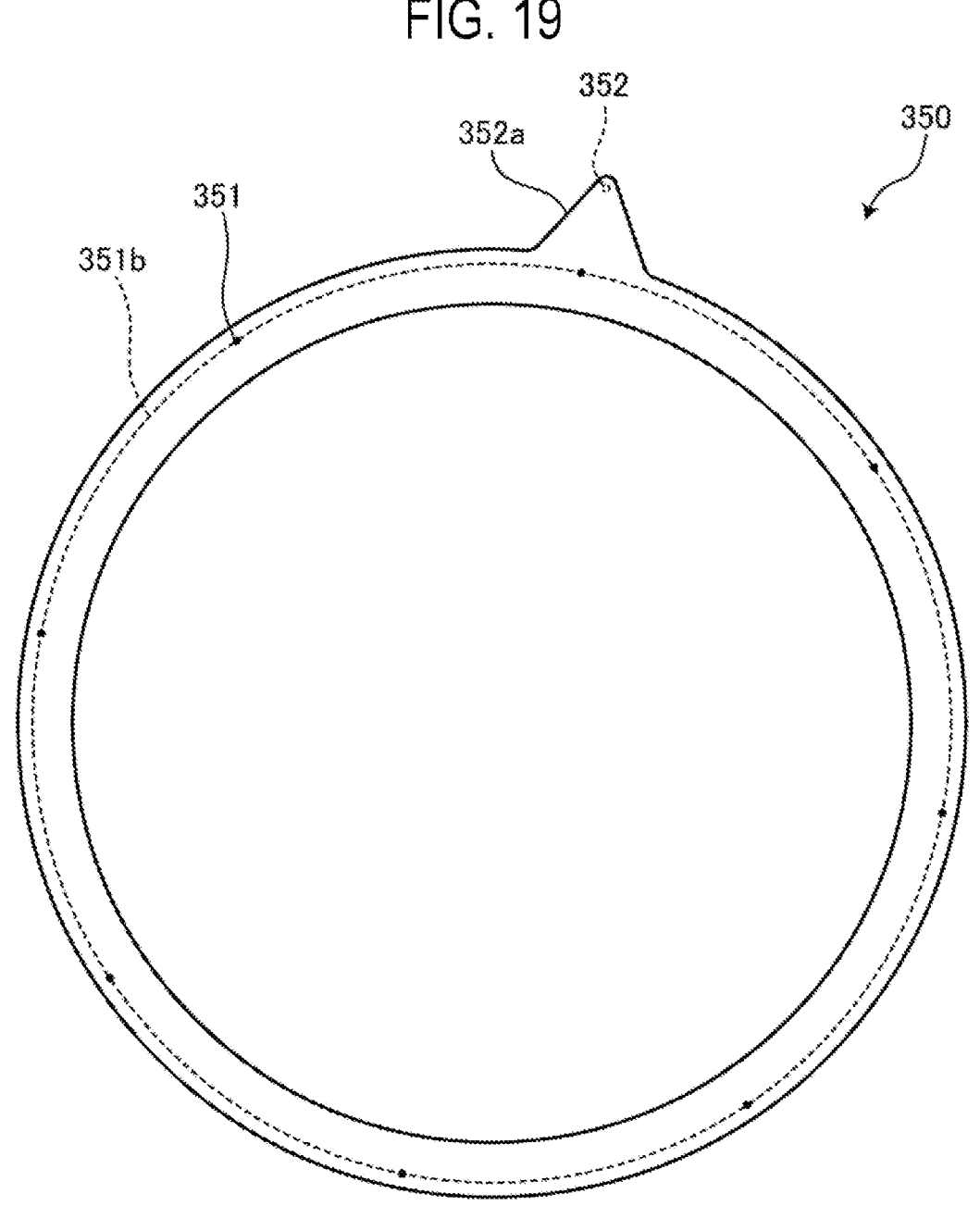
FIG. 19 is a sectional view showing an example of the supply layer to the electrostatic electrode as seen in a plan view.

FIG. 19 is a sectional view showing an example of the supply layer to the electrostatic electrode in a plan view. As shown in FIG. 19, the supply layer 350 is formed in a ring shape to extend from the vicinity of the boundary between the central region 111a and the annular region 111b to a portion of the annular region 111b where the edge ring 1120 is placed. The supply layer 350 has a thickness of, for example, 10 μm to 20 μm. In the supply layer 350, the respective vias 351 are arranged on a circumference 351b. That is, the supply layer 350 is electrically connected to the electrostatic electrode 1111b through the respective vias 351. In addition, the supply layer 350 is electrically connected to a terminal 353 via a via 352 provided in, for example, a protrusion 352a formed at one location on the outer peripheral side.

Figure 20:
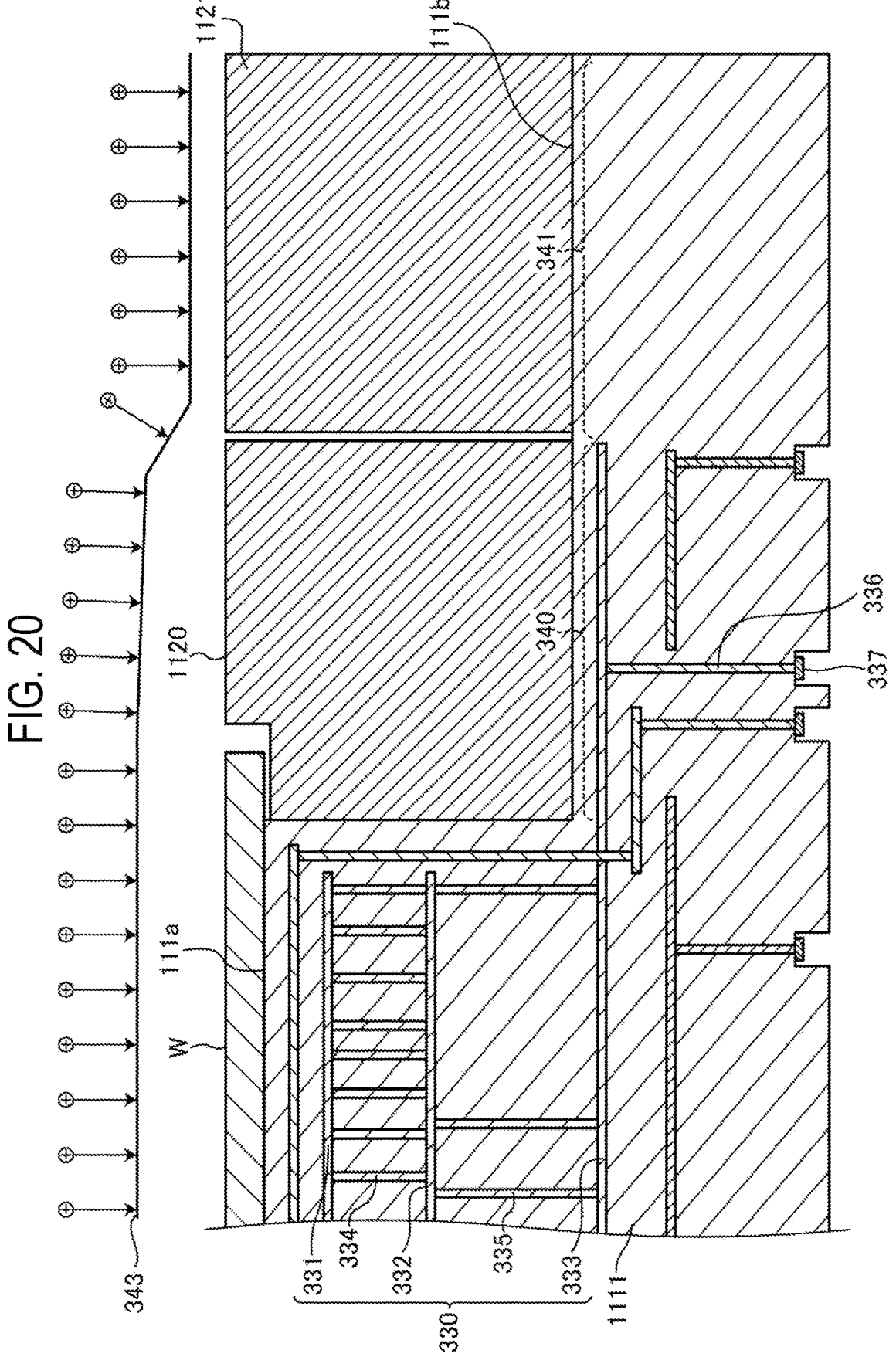
FIG. 20 is a diagram showing an example of the sheath electric potential in the vicinity of the ring assembly according to the second embodiment.

Next, the sheath electric potential near the boundary between the central region 111a and the annular region 111b will be described with reference to FIG. 20. FIG. 20 is a diagram showing an example of the sheath electric potential near the ring assembly according to the second embodiment. In FIG. 20, a specific electric potential of plasma sheath is represented as a sheath electric potential 343. As shown in FIG. 20, in the central region 111a, a bias RF signal is supplied from the terminal 337 to the first layer 331 through the via 336, the third layer 333, the via 335, the second layer 332, and the via 334 so that the central region 111a acts as a bias electrode. In the region of the annular region 111b where the edge ring 1120 is placed, a bias RF signal is supplied from the terminal 337 to the third layer 333 including the region 340 through the via 336 so that the region 340 acts as a bias electrode. At this time, the impedance of the path extending from the first layer 331 through the substrate W and the impedance of the path extending from the region 340 through the edge ring 1120 are close to each other, whereby the height of the sheath electric potential 343 is substantially equal above the substrate W and above the edge ring 1120. That is, the region 340 of the third layer 333 exists in the region of the annular region 111b where the edge ring 1120 is placed, whereby the sheath electric potential 343 above the edge ring 1120 is substantially equal to that above the substrate W. Therefore, in the electrostatic chuck 1111 of the second embodiment, ions are vertically incident even at the edge of the substrate W, so that the tilting of the holes formed in the substrate W can be suppressed. On the other hand, the region of the annular region 111b where the cover ring 1121 is placed is the region 341 where the third layer 333 does not exist, whereby the sheath electric potential 343 above the cover ring 1121 is lowered. As a result, it is possible to suppress damage and consumption of the cover ring 1121. In addition, the existence of the region 340 can reduce the influence of the thickness of the edge ring 1120 on the sheath electric potential 343. This makes it possible to make the thickness of the edge ring 1120 thicker and to prolong the lifespan of the edge ring 1120.

[Experimental Result]

Figure 21:
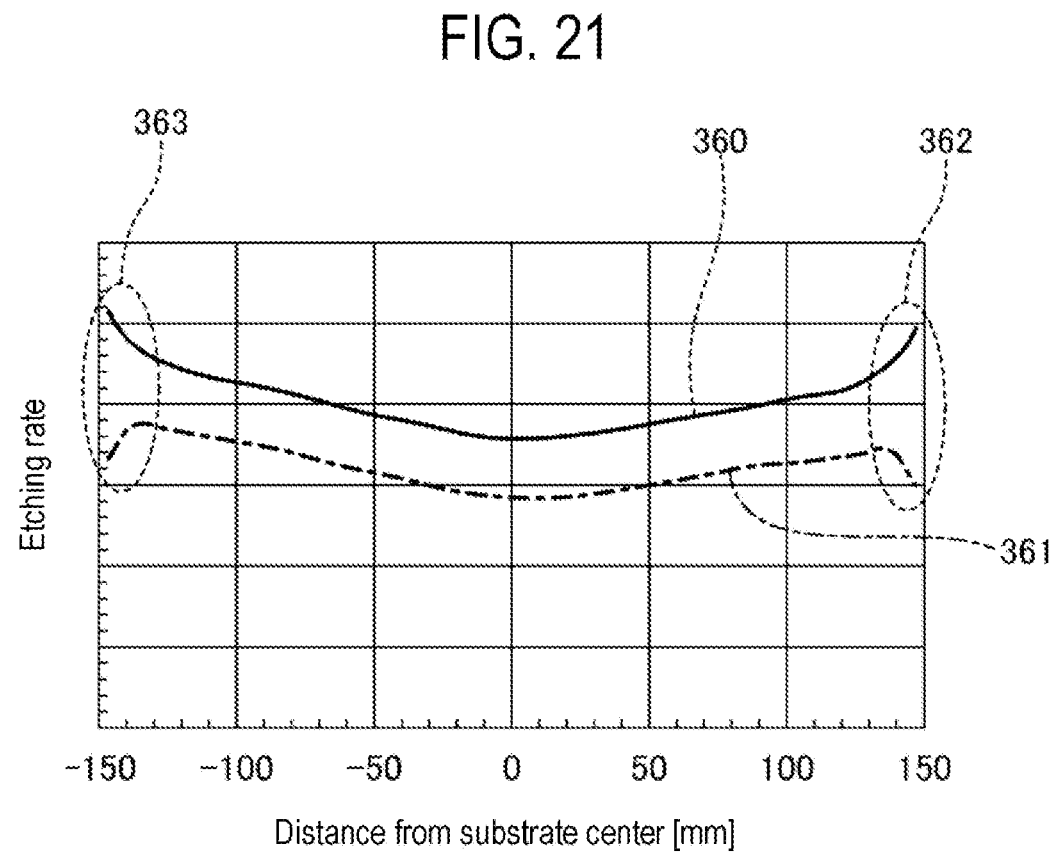

Next, experimental results in the second embodiment will be described with reference to FIG. 21. FIG. 21 is a diagram showing an example of experimental results in the second embodiment. In FIG. 21, as graphs of the etching rate in the radial direction of the substrate W, there are shown a graph 360 of an example in which the electrostatic chuck 1111 of the second embodiment is used and a graph 361 of a reference example in which a bias RF signal is supplied to the base 1110h. The processing conditions for both the example and the reference example are set such that the pressure in the plasma processing chamber 10 is 20 mTorr (2.67 Pa), the 27 MHz source RF signal is supplied at 500 W, and the 400 kHz bias RF signal is supplied at 1600 W. The etching rate in the example was ±3.5% as shown in the graph 360. Further, the electric potential (Vpp) of the substrate W in the example was 2424 V. On the other hand, the etching rate in the reference example was ±2.5% as shown in the graph 361. Further, the electric potential (Vpp) of the substrate W in the reference example was 3337 V. That is, in the example, the etching rate is increased by about 5% and the electric potential (Vpp) of the substrate W is lowered by about 28% as compared with the reference example.

Furthermore, comparing the graph 360 and the graph 361, the graph 360 rises smoothly and the graph 361 falls in the regions 362 and 363 near the edge of the substrate W. Presumably, this is because in the example, the sheath electric potential does not drop at the edge of the substrate W and the tilting does not occur, whereas in the reference example, the sheath electric potential drops at the edge of the substrate W and the tilting occurs. Thus, in the second embodiment, the distance between the region 340 of the first layer 331 and the third layer 333 functioning as bias electrodes and the substrate W and the edge ring 1120 is short, which makes it possible to reduce the impedance of each path. Therefore, it is possible to allow a large amount of current to flow as a bias RF signal to reduce the voltage, and it is possible to suppress abnormal discharge in each part of the electrostatic chuck 1111 (e.g., the rear surface of the placed substrate W, the lift pin holes, the helium supply holes, etc.). Moreover, in the example, when the bias RF signal having the same electric power as that of the reference example is supplied from the RF power supply 31, the etching rate can be made higher than that in the reference example. That is, in the second embodiment, it is possible to use up to a high power range without abnormal discharge, and it is possible to increase the etching rate by improving the RF efficiency.

As described above, according to each embodiment, the substrate support 11 is a substrate support 11 arranged in a processing container (plasma processing chamber 10), including: an electrostatic chuck 1111 provided with a first support surface (central region 111a) for supporting a substrate W, provided with a first electrode (electrostatic electrode 1111b) and a second electrode (bias electrode 33 or 330) which are arranged in the electrostatic chuck 1111 sequentially from the first support surface, and made of a dielectric material; and a base 1110 configured to support the electrostatic chuck 1111, wherein the second electrode is arranged at a position having a distance to the first support surface that is equal to or less than a distance to the base, a voltage for attracting the substrate W is applied to the first electrode, and bias power is supplied to the second electrode. As a result, it is possible to improve the efficiency of the bias power on the low frequency side.

Further, according to each embodiment, the base 1110 is formed of a conductive member. As a result, it is possible to improve the efficiency of the bias power on the low frequency side.

Further, according to each embodiment, the second electrode is arranged at a position having the distance to the first support surface less than the distance to the base 1110. As a result, it is possible to improve the efficiency of the bias power on the low frequency side.

Further, according to each embodiment, the electrostatic chuck 1111 is further provided with a heater electrode 1111c therein, and the second electrode is arranged between the first electrode and the heater electrode 1111c. As a result, the heater electrode 1111c and the bias electrode 33 or 330 can be allowed to have substantially the same electric potential.

Further, according to the first embodiment, the electrostatic chuck 1111 is provided with a second support surface (annular region 111b) for surrounding the first support surface and supporting an edge ring (ring assembly 112), and provided with a third electrode (electrostatic electrode 1111d) and a fourth electrode (bias electrode 34) arranged in the electrostatic chuck 1111 sequentially from the second support surface, the fourth electrode is arranged at a position having a distance to the second support surface that is equal to or less than a distance to the base 1110, a voltage for attracting the edge ring is applied to the third electrode, and bias power is supplied to the fourth electrode. As a result, even in the annular region 111b, it is possible to improve the efficiency of the bias power on the low frequency side.

Further, according to the first embodiment, the third electrode is integrated with the first electrode. As a result, even in the annular region 111b, it is possible to improve the efficiency of the bias power on the low frequency side.

Further, according to each embodiment, the electrostatic chuck 1111 is provided with a second support surface (annular region 111b) for surrounding the first support surface and supporting an edge ring (ring assembly 112), and provided with a fourth electrode (bias electrode 34 and region 340) inside the second support surface, the fourth electrode is arranged at a position having a distance to the second support surface that is equal to or less than a distance to the base 1110, and bias power is supplied to the fourth electrode. As a result, even in the annular region 111b, it is possible to improve the efficiency of the bias power on the low frequency side.

Further, according to each embodiment, the fourth electrode is arranged at a position having the distance to the second support surface less than the distance to the base 1110. As a result, even in the annular region 111b, it is possible to improve the efficiency of the bias power on the low frequency side.

Further, according to each embodiment, the fourth electrode is integrated with the second electrode. As a result, even in the annular region 111b, it is possible to improve the efficiency of the bias power on the low frequency side.

Further, according to modification 7, the base 1110 is made of a dielectric material, and a conductive adhesive layer 1112 is provided between the base 1110 and the electrostatic chuck 1111. As a result, even if the base 1110 is a dielectric material, it is possible to improve the efficiency of the bias power on the low frequency side.

Further, according to each embodiment, the second electrode is further supplied with source power for plasma generation. As a result, even when the source power is supplied from below the substrate W, it is possible to improve the efficiency of the bias power on the low frequency side.

Further, according to each embodiment and modifications 1 and 7, the second electrode is not electrically connected to the base 1110 or the conductive adhesive layer 1112. As a result, it is possible to improve the efficiency of the bias power on the low frequency side.

Further, according to modifications 2 to 7, the second electrode is electrically connected to the base 1110 or the conductive adhesive layer 1112, and the bias power is supplied to the base 1110 or the conductive adhesive layer 1112. As a result, it is possible to suppress electric discharge in various holes inside the base 1110.

Further, according to each embodiment and modifications 1 to 6, the second electrode is electrically connected to the base 1110 or the conductive adhesive layer 1112 by using conductive paste, sintered silver, a brazing material, a solder, a socket, a leaf spring, or caulking of a power supply line. As a result, the base 1110 or the conductive adhesive layer 1112 and the bias electrodes 33, 34 and 330 can be kept at the same electric potential.

Further, according to each embodiment, the bias power is an AC or DC pulse. As a result, it is possible to improve the efficiency of the bias power on the low frequency side.

Further, according to the second embodiment, the second electrode (bias electrode 330) is provided with a first layer (first layer 331) and a second layer (second layer 332), the dielectric material is disposed between the first layer and the second layer, and the first layer and the second layer are connected by a plurality of vias 334. As a result, it is possible to suppress abnormal discharge, and it is possible to improve the in-plane uniformity and the etching rate.

Further, according to the second embodiment, the second support surface is configured to support an edge ring 1120 made of a conductive material or a semiconductor and a cover ring 1121 made of a dielectric material. The fourth electrode is arranged within the electrostatic chuck 1111 corresponding to the edge ring 1120 and not arranged within the electrostatic chuck 1111 corresponding to the cover ring 1121. As a result, it is possible to suppress the tilting of the holes formed at the edge of the substrate W. Since the sheath electric potential 343 above the cover ring 1121 is lowered, it is possible to suppress damage and wear to the cover ring 1121.

Each embodiment disclosed herein should be considered to be exemplary and not limitative in all respects. Each of the above-described embodiments may be omitted, substituted, or modified in various ways without departing from the scope and spirit of the appended claims.

Further, in each of the above-described embodiments, there has been described the case where the bias RF signal is supplied from the second RF generator 31*b* as the bias power. However, the present disclosure is not limited thereto. For example, a bias DC signal may be supplied from the bias DC generator 32*a* as the bias power.

Further, in each of the above-described embodiments, the plasma processing apparatus 1 that performs processing such as etching or the like on the substrate W by using inductively coupled plasma as a plasma source has been described as an example. However, the technique disclosed herein is not limited thereto. The plasma source is not limited to the inductively coupled plasma, and any plasma source such as capacitively coupled plasma, microwave plasma, magnetron plasma, or the like can be used as long as the apparatus uses plasma to process the substrate W.

The present disclosure may also take the following configurations.

(1) A substrate support arranged in a processing container, including:

an electrostatic chuck provided with a first support surface for supporting a substrate, provided with a first electrode and a second electrode which are arranged in the electrostatic chuck sequentially from the first support surface, and made of a dielectric material; and a base configured to support the electrostatic chuck, wherein the second electrode is arranged at a position having a distance to the first support surface that is equal to or less than a distance to the base, a voltage for attracting the substrate is applied to the first electrode, and bias power is supplied to the second electrode.

(2) The substrate support of (1), wherein the base is formed of a conductive member.

(3) The substrate support of (1) or (2), wherein the second electrode is arranged at a position having the distance to the first support surface less than the distance to the base.

(4) The substrate support of any one of (1) to (3), wherein the electrostatic chuck is further provided with a heater electrode therein, and the second electrode is arranged between the first electrode and the heater electrode.

(5) The substrate support of any one of (1) to (4), wherein the electrostatic chuck is provided with a second support surface for surrounding the first support surface and supporting an edge ring and provided with a third electrode and a fourth electrode arranged in the electrostatic chuck sequentially from the second support surface, the fourth electrode is arranged at a position having a distance to the second support surface that is equal to or less than a distance to the base, a voltage for attracting the edge ring is applied to the third electrode, and bias power is supplied to the fourth electrode.

(6) The substrate support of (5), wherein the third electrode is integrated with the first electrode.

(7) The substrate support of any one of (1) to (4), wherein the electrostatic chuck is provided with a second support surface for surrounding the first support surface and supporting an edge ring and provided with a fourth electrode inside the second support surface, the fourth electrode is arranged at a position having a distance to the second support surface that is equal to or less than a distance to the base, and bias power is supplied to the fourth electrode.

(8) The substrate support of any one of (5) to (7), wherein the fourth electrode is arranged at a position having the distance to the second support surface less than the distance to the base.

(9) The substrate support of any one of (5) to (8), wherein the fourth electrode is integrated with the second electrode.

(10) The substrate support of (1), wherein the base is made of a dielectric material, and a conductive adhesive layer is provided between the base and the electrostatic chuck.

(11) The substrate support of any one of (1) to (10), wherein the second electrode is further supplied with source power for plasma generation.

(12) The substrate support of any one of (1) to (11), wherein the second electrode is not electrically connected to the base or the conductive adhesive layer.

(13) The substrate support of any one of (1) to (11), wherein the second electrode is electrically connected to the base or the conductive adhesive layer, and the bias power is supplied to the base or the conductive adhesive layer.

(14) The substrate support of (13), wherein the second electrode is electrically connected to the base or the conductive adhesive layer by using conductive paste, sintered silver, a brazing material, a solder, a socket, a leaf spring, or caulking of a power supply line.

(15) The substrate support of any one of (1) to (14), wherein the bias power is an AC or DC pulse.

(16) The substrate support of any one of (1) to (15), wherein the second electrode is provided with a first layer and a second layer, the dielectric material is disposed between the first layer and the second layer, and the first layer and the second layer are connected by a plurality of vias.

(17) The substrate support of any one of (5) to (9), wherein the second support surface is configured to support an edge ring made of a conductive material or a semiconductor and a cover ring made of a dielectric material, and the fourth electrode is arranged within the electrostatic chuck corresponding to the edge ring and not arranged within the electrostatic chuck corresponding to the cover ring.

(18) A plasma processing apparatus, comprising:

a processing container; and a substrate support arranged inside the processing container, wherein the substrate support includes an electrostatic chuck provided with a first support surface for supporting a substrate, provided with a first electrode and a second electrode which are arranged in the electrostatic chuck sequentially from the first support surface, and made of a dielectric material, and a base configured to support the electrostatic chuck, the second electrode is arranged at a position having a distance to the first support surface that is equal to or less than a distance to the base, a voltage for attracting the substrate is applied to the first electrode, and bias power is supplied to the second electrode.

According to the present disclosure, it is possible to improve the efficiency of bias power on the low frequency side.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate support arranged in a processing container, comprising:

an electrostatic chuck provided with a first support surface for supporting a substrate, provided with a first electrode and a second electrode which are arranged in the electrostatic chuck sequentially from the first support surface, provided with a second support surface for surrounding the first support surface and supporting an edge ring, and made of a dielectric material; and a base configured to support the electrostatic chuck, wherein a distance between the second electrode and the first support surface is less than a distance between the second electrode and the base, wherein the second electrode is arranged at a position higher than the second support surface, wherein a voltage for attracting the substrate is applied to the first electrode, and wherein bias power is supplied to the second electrode.

2. The substrate support of claim 1, wherein the base is formed of a conductive member.

3. The substrate support of claim 1, wherein the electrostatic chuck is further provided with a heater electrode therein, and the second electrode is arranged between the first electrode and the heater electrode.

4. The substrate support of claim 1, wherein the electrostatic chuck is provided with a third electrode and a fourth electrode arranged in the electrostatic chuck sequentially from the second support surface, a distance between the fourth electrode and the second support surface is equal to or less than a distance between the fourth electrode and the base, a voltage for attracting the edge ring is applied to the third electrode, and bias power is supplied to the fourth electrode.

5. The substrate support of claim 4, wherein the third electrode is integrated with the first electrode.

6. The substrate support of claim 4, wherein the distance between the fourth electrode and the second support surface is less than the distance between the fourth electrode and the base.

7. The substrate support of claim 4, wherein the fourth electrode is integrated with the second electrode.

8. The substrate support of claim 1, wherein the electrostatic chuck is provided with a fourth electrode inside the second support surface, a distance between the fourth electrode and the second support surface is equal to or less than a distance between the fourth electrode and the base, and bias power is supplied to the fourth electrode.

9. The substrate support of claim 1, wherein the base is made of a dielectric material, and a conductive adhesive layer is provided between the base and the electrostatic chuck.

10. The substrate support of claim 9, wherein the second electrode is not electrically connected to the base or the conductive adhesive layer.

11. The substrate support of claim 9, wherein the second electrode is electrically connected to the base or the conductive adhesive layer, and the bias power is supplied to the base or the conductive adhesive layer.

12. The substrate support of claim 11, wherein the second electrode is electrically connected to the base or the conductive adhesive layer by using conductive paste, sintered silver, a brazing material, a solder, a socket, a leaf spring, or caulking of a power supply line.

13. The substrate support of claim 1, wherein the second electrode is further supplied with source power for plasma generation.

14. The substrate support of claim 1, wherein the bias power is an AC or DC pulse.

15. The substrate support of claim 1, wherein the second electrode is provided with a first layer and a second layer, the dielectric material is disposed between the first layer and the second layer, and the first layer and the second layer are connected by a plurality of vias.

16. The substrate support of claim 8, wherein the second support surface is configured to support the edge ring made of a conductive material or a semiconductor and a cover ring made of a dielectric material, and the fourth electrode is arranged within the electrostatic chuck corresponding to the edge ring and not arranged within the electrostatic chuck corresponding to the cover ring.

17. A plasma processing apparatus, comprising:

a processing container; and a substrate support arranged inside the processing container, wherein the substrate support includes an electrostatic chuck provided with a first support surface for supporting a substrate, provided with a first electrode and a second electrode which are arranged in the electrostatic chuck sequentially from the first support surface, provided with a second support surface for surrounding the first support surface and supporting an edge ring, and made of a dielectric material, and a base configured to support the electrostatic chuck, a distance between the second electrode and the first support surface is less than a distance between the second electrode and the base, the second electrode is arranged at a position higher than the second support surface, a voltage for attracting the substrate is applied to the first electrode, and bias power is supplied to the second electrode.

* * * * *